US008618536B2

(12) United States Patent
Sugano

(10) Patent No.: US 8,618,536 B2
(45) Date of Patent: Dec. 31, 2013

(54) ORGANIC LIGHT-EMITTING ELEMENT, DISPLAY PANEL, DISPLAY DEVICE, AND MANUFACTURING METHOD FOR ORGANIC LIGHT-EMITTING ELEMENT

(71) Applicant: Panasonic Corporation, Osaka (JP)

(72) Inventor: Kou Sugano, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/720,052

(22) Filed: Dec. 19, 2012

(65) Prior Publication Data
US 2013/0187133 A1 Jul. 25, 2013

Related U.S. Application Data

(63) Continuation of application No. PCT/JP2010/004279, filed on Jun. 29, 2010.

(51) Int. Cl.
H01L 29/08 (2006.01)
H01L 35/24 (2006.01)
H01L 51/00 (2006.01)

(52) U.S. Cl.
USPC .......... 257/40; 257/13; 257/86; 257/94; 438/402; 438/781

(58) Field of Classification Search
USPC .......... 257/13, 40, 86, 94; 438/402, 781
See application file for complete search history.

(56) References Cited

U.S. PATENT DOCUMENTS

| 5,443,922 | A | 8/1995 | Nishizaki et al. | |
| 6,952,023 | B2 | 10/2005 | Yamazaki et al. | |
| 7,144,819 | B2* | 12/2006 | Sato et al. | 438/700 |
| 7,579,270 | B2* | 8/2009 | Sato et al. | 438/618 |
| 2003/0001278 | A1 | 1/2003 | Kojima et al. | |
| 2003/0025166 | A1 | 2/2003 | Yamazaki et al. | |
| 2004/0069987 | A1 | 4/2004 | Yoneda et al. | |
| 2004/0222429 | A1 | 11/2004 | Yamazaki et al. | |
| 2005/0067953 | A1 | 3/2005 | Yamazaki et al. | |
| 2005/0087769 | A1 | 4/2005 | Yamazaki et al. | |
| 2005/0264175 | A1 | 12/2005 | Yamazaki et al. | |
| 2006/0202615 | A1* | 9/2006 | Murakami et al. | 313/506 |
| 2007/0181890 | A1 | 8/2007 | Yamazaki et al. | |
| 2008/0105877 | A1 | 5/2008 | Yamazaki et al. | |
| 2008/0217617 | A1 | 9/2008 | Sugawa et al. | |

(Continued)

FOREIGN PATENT DOCUMENTS

JP 5-163488 6/1993
JP 2003-17561 1/2003

(Continued)

OTHER PUBLICATIONS

ISR (ISA/210) of PCT JP/2010/004279 (PCT-1225).

Primary Examiner — Jarrett Stark
Assistant Examiner — Nicholas Tobergte
(74) Attorney, Agent, or Firm — Greenblum & Bernstein, P.L.C.

(57) ABSTRACT

A planarization film is formed as a silicon oxide monolayer using, for instance, a spin coat method, through, for example, applying a silicon-containing organic solvent to an upper portion of a TFT layer and planarizing an upper surface of a resist film made up of a silicon-containing organic solvent, heating a predetermined processing fluid, e.g., peroxymonosulfuric acid, and discharging the processing fluid heated to, for example, 150° C., onto the planarized upper surface of the resist film such that organic components of the resist film are dissolved while silicon in the resist film is oxidized by the processing fluid.

27 Claims, 17 Drawing Sheets

(56) References Cited

U.S. PATENT DOCUMENTS

| | | |
|---|---|---|
| 2011/0027920 A1 | 2/2011 | Yamazaki et al. |
| 2011/0291085 A1 | 12/2011 | Kondoh et al. |

FOREIGN PATENT DOCUMENTS

| | | |
|---|---|---|
| JP | 2003-217855 | 7/2003 |
| JP | 2004-63126 | 2/2004 |
| JP | 2005-108825 | 4/2005 |
| JP | 2005-150105 | 6/2005 |
| JP | 2006-84905 | 3/2006 |
| JP | 2006-113568 | 4/2006 |
| JP | 2006-191127 | 7/2006 |
| JP | 2006-310106 | 11/2006 |
| JP | 2010-80709 | 4/2010 |
| WO | 2007/004666 | 1/2007 |

* cited by examiner

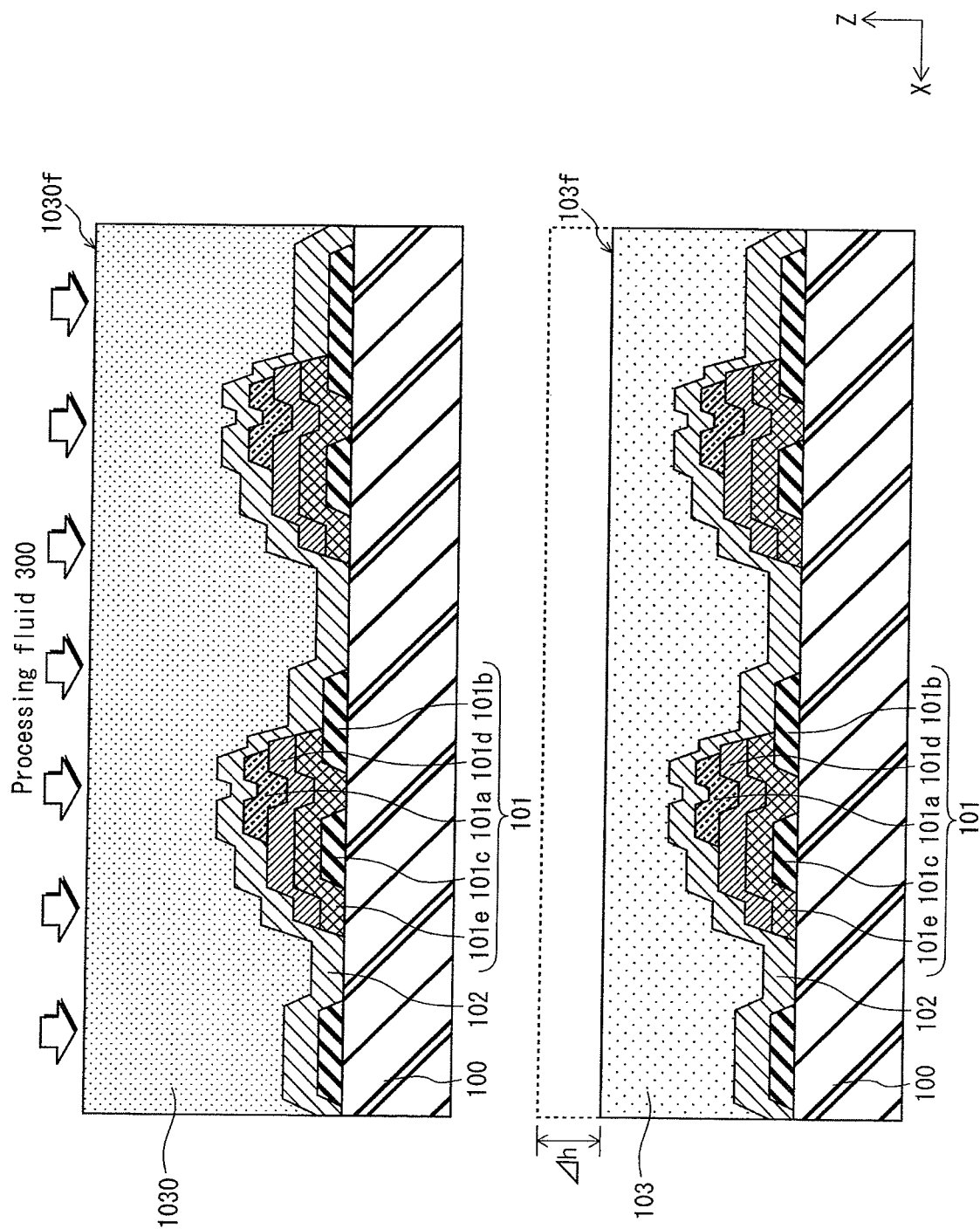

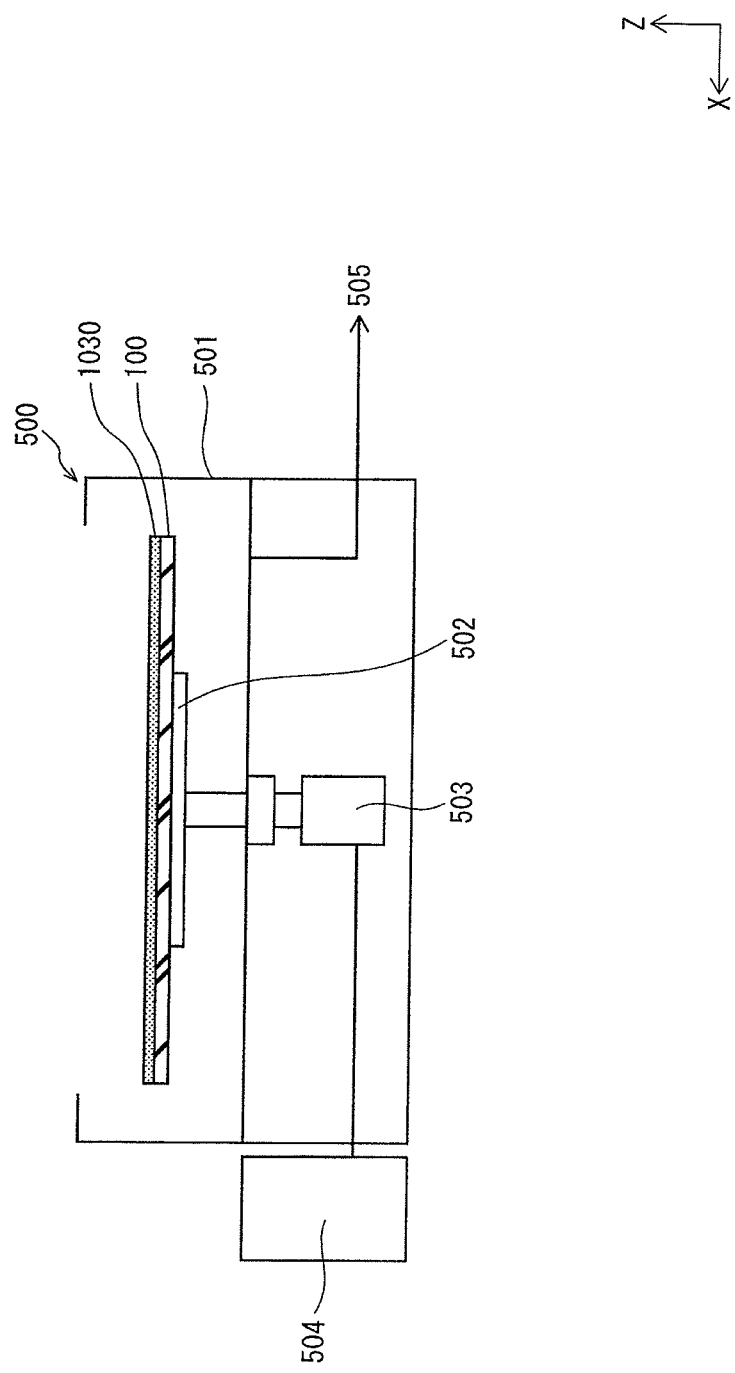

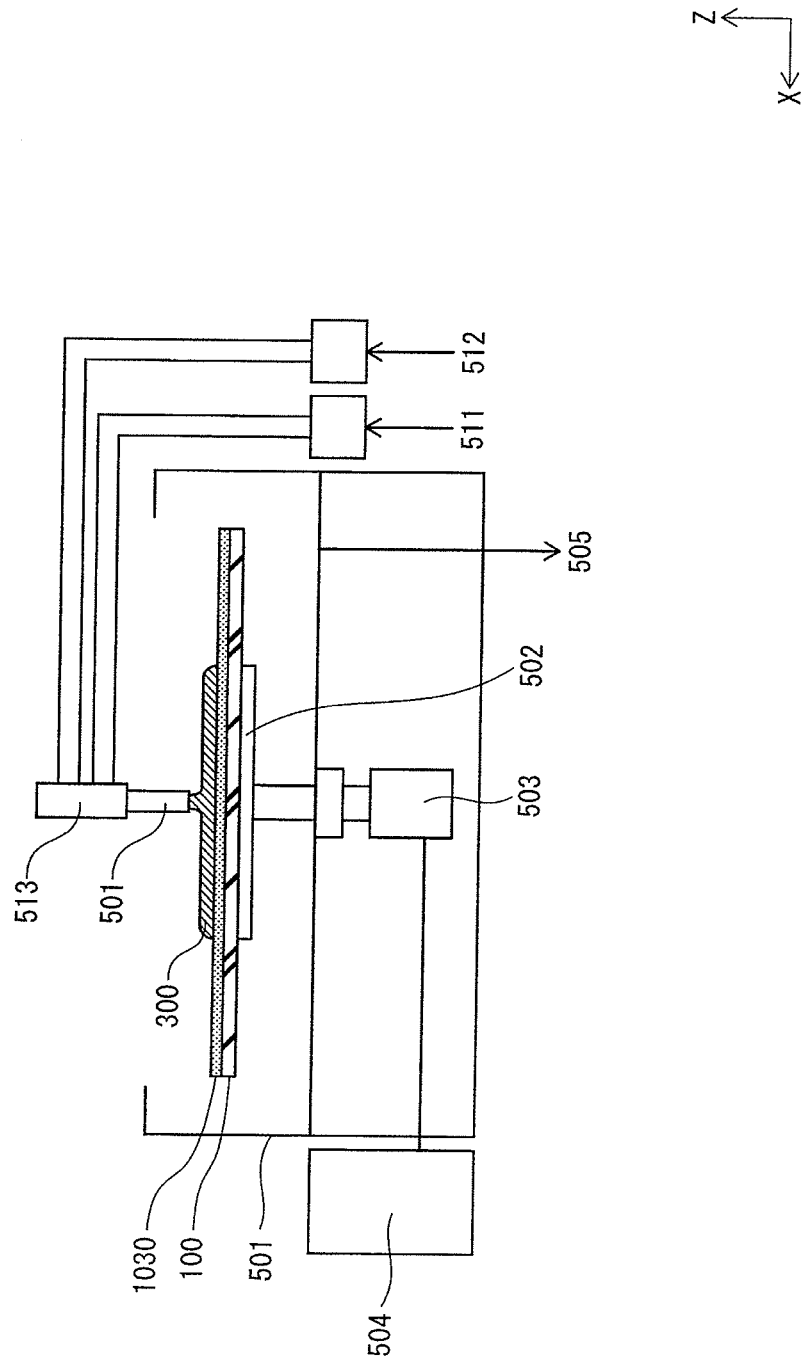

FIG. 12A
Unprocessed full-face oxidation film
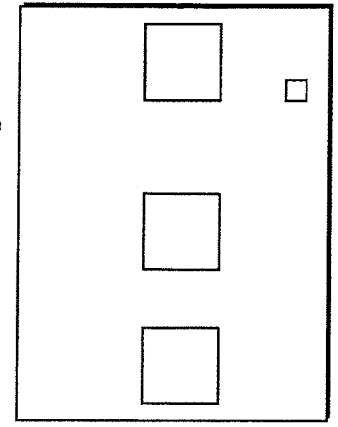
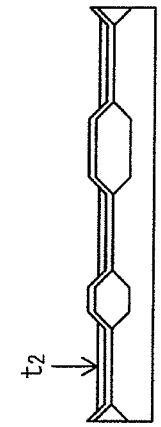
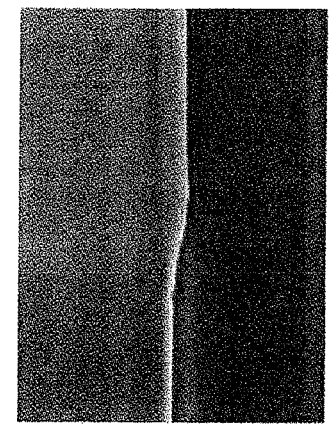
FIG. 12B
Application of resist film with added Si, thickness: $t_1$
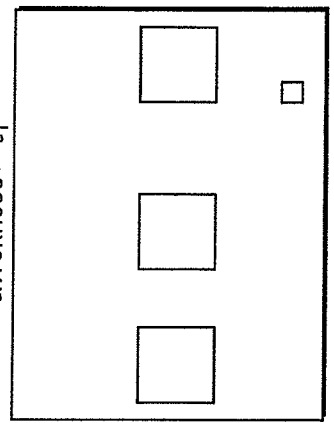
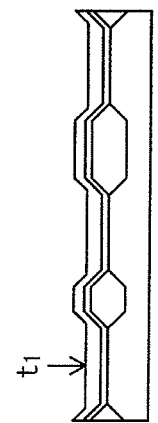
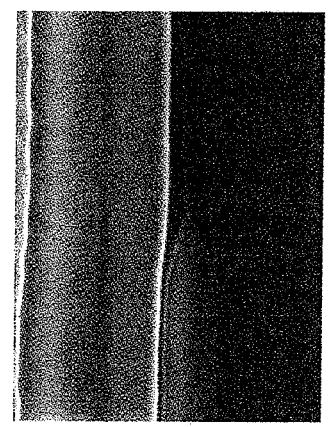
FIG. 12C
Liquid phase oxidation film, thickness: $t_2$
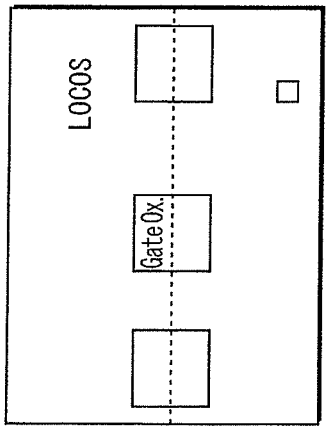
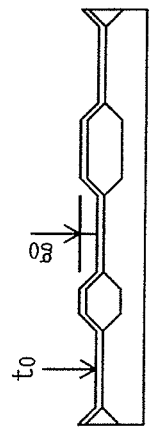
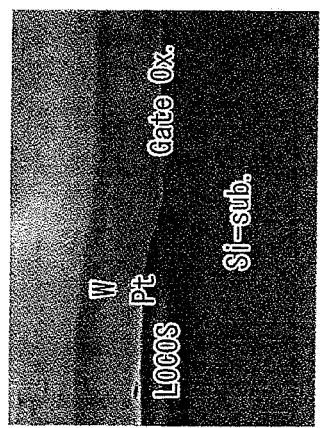

Resist film with added Si

Liquid phase oxidation film

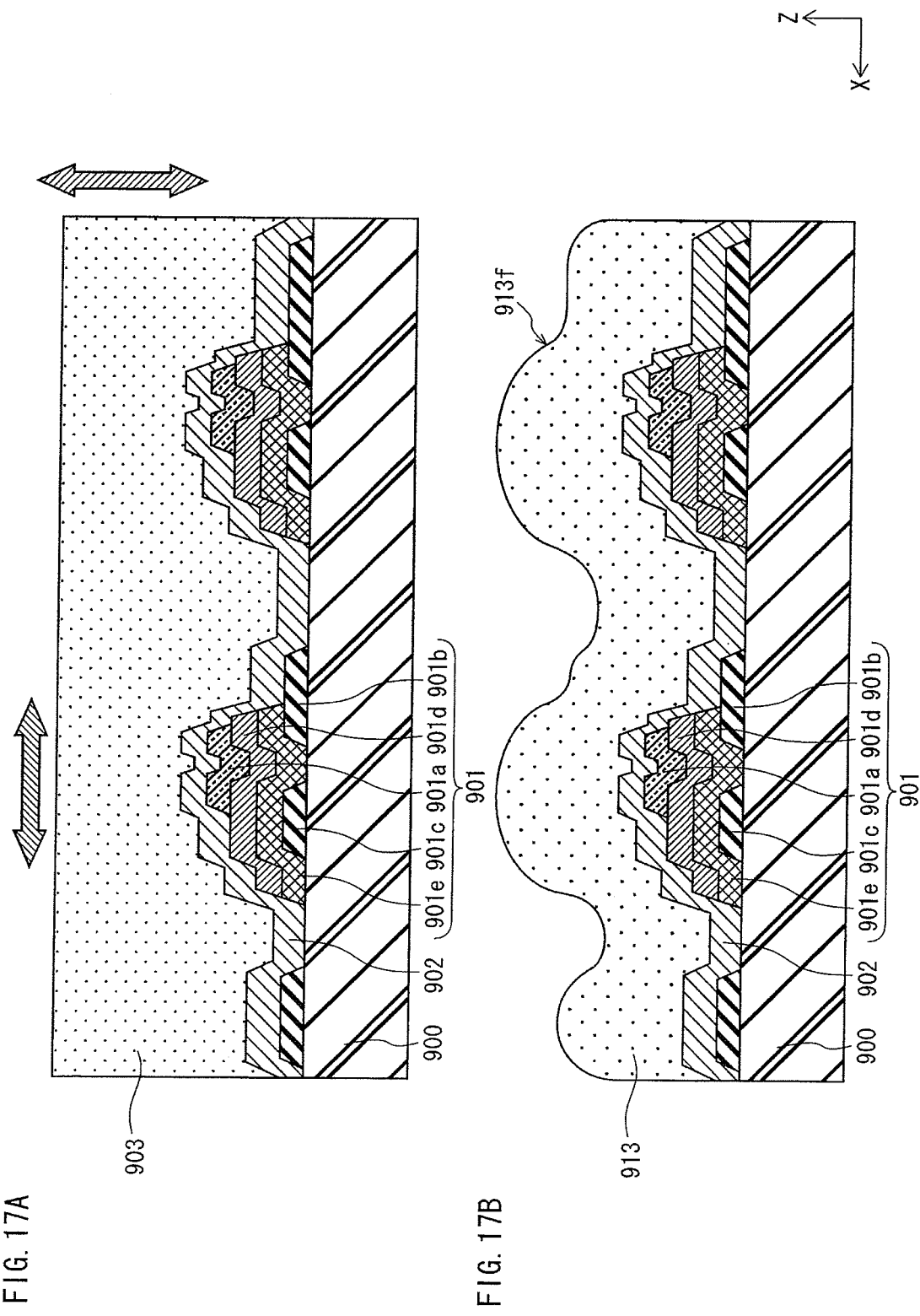

ically and having the planarization film 903, which is an organic film, is prone to expansion, contraction, and bubble formation due to peeling and to absorption of water produced during the planarization film 903 formation process. This causes a decrease in useful life. Specifically, the steps performed after forming the planarization film 903 realize the organic EL layer. However, the organic EL layer formation step involves the use of water and heat. As such, water is absorbed by the planarization film, and the effect of heat causes contraction and expansion. As a result, the planarization film is shifted up, down, left, and right, so as to be unable to maintain planarity at the upper surface. Accordingly, the useful life of the organic EL layer formed thereon is plausibly reduced.

ORGANIC LIGHT-EMITTING ELEMENT, DISPLAY PANEL, DISPLAY DEVICE, AND MANUFACTURING METHOD FOR ORGANIC LIGHT-EMITTING ELEMENT

CROSS-REFERENCE TO RELATED APPLICATION

This is a continuation application of PCT Application No. PCT/JP2010/004279 filed Jun. 29, 2010, designating the United States of America, the disclosure of which, including the specification, drawings and claims, is incorporated herein by reference in its entirety.

TECHNICAL FIELD

The present disclosure relates to an organic light-emitting element, a display panel, a display device, and a manufacturing method for an organic light-emitting element.

DESCRIPTION OF THE RELATED ART

In recent years, progress and discoveries have been made in the field of display devices that employ the phenomenon of organic material electroluminescence. In such a display device, each sub-pixel includes an anode and a cathode having an organic electroluminescence element (hereinafter, organic EL element) that includes an organic light-emitting layer sandwiched therebetween. The operation of such a display device that includes an organic EL layer involves holes injected from the anode and electrons injected from the cathode such that the holes and electrons recombine in the organic light-emitting layer, thus causing light to be emitted.

The organic EL layer of the display device is formed with an insulating planarization film over a thin-film transistor layer (hereinafter, TFT layer) formed on a substrate. This prevents irregularities in an upper surface of the TFT layer from affecting the formation of a base surface for forming the organic EL layer. Conventional technology allows for a TFT layer provided on a substrate, and for a planarization film with a configuration described with reference to FIG. 17A.

As shown, an upper surface in the Z dimension of a substrate 900 has a TFT layer 901 formed thereon, and has a passivation film 902 formed so as to cover the TFT layer 901. The TFT layer 901 is formed from a gate electrode 901a, a drain electrode 901b, a source electrode 901c, a gate insulation film 901d, and a channel layer 101e.

The passivation film 902 has a planarization film 903 formed thereover, such that the upper surface with respect to the Z dimension is planarised. The organic EL layer is formed at the upper surface, with respect to the Z dimension, of the planarization film 903 thus planarised.

A display device pertaining to conventional technology uses an organic film as the planarization film 903 (e.g., Patent Literature 1 and 2). The planarization film 903, which is an organic film, is applied over the substrate 901 on which the TFT layer 901 and the passivation film 902 are formed, and is provided by baking after leveling.

CITATION LIST

Patent Literature

[Patent Literature 1]
Japanese Patent Application Publication No. 2003-217855
[Patent Literature 2]
Japanese Patent Application Publication No. 2004-63126

SUMMARY

However, the display device pertaining to conventional technology and having the planarization film 903, which is an organic film, is prone to expansion, contraction, and bubble formation due to peeling and to absorption of water produced during the planarization film 903 formation process. This causes a decrease in useful life. Specifically, the steps performed after forming the planarization film 903 realize the organic EL layer. However, the organic EL layer formation step involves the use of water and heat. As such, water is absorbed by the planarization film, and the effect of heat causes contraction and expansion. As a result, the planarization film is shifted up, down, left, and right, so as to be unable to maintain planarity at the upper surface. Accordingly, the useful life of the organic EL layer formed thereon is plausibly reduced.

Patent Literature 2 proposes forming a protective layer of an inorganic material so as to cover the upper surface of the planarization film, and forming the organic EL layer over the protective layer. However, although such technology of covering the upper surface of the planarization film with a protective film may interrupt the passage of water between the planarization film and the organic EL layer, the planarization film made of organic material is made unable to retreat from any water absorbed into the device. This does not resolve the problem of contraction and expansion due to heat, and does not preserve the planarity of the upper surface.

Also, as shown in FIG. 17B, the planarization film 903 made of an organic material may be replaced by a planarization film 913 made of an inorganic material. This is potentially effective in avoiding the effects of water.

However, as shown, when the planarization film 913 is made of an inorganic material, the upper surface with respect to the Z dimension 913f conforms to the irregularities of the TFT layer 901, and is thus unable to preserve planarity.

One non-limiting and exemplary embodiment provides a planarization film having a highly planarised upper surface, and thus provides a manufacturing method for an organic light-emitting element, a display panel, a display device, and an organic light-emitting element, each having superb light-emitting properties and useful life.

In a first aspect, an organic light-emitting element comprises: an organic EL layer including a pair of electrodes and an organic light-emitting layer disposed between the pair of electrodes; a thin-film transistor (hereinafter, TFT) layer formed below the organic EL layer, being electrically connected to one electrode of the pair of electrodes, and causing the organic EL layer to emit light; and a planarization film disposed between the organic EL layer and the TFT layer, planarizing irregularities in an upper portion of the TFT layer such that the organic EL layer is formed over a planarised surface.

The planarization film is made up of a silicon oxide monolayer, and the planarization film made up of the silicon oxide monolayer is formed through: using a predetermined liquid phase film formation method to apply a silicon-bearing organic solvent to the upper portion of the TFT layer and to planarize an upper surface of the silicon-bearing organic solvent, thus forming a silicon-bearing organic solvent film; heating a predetermined solvent that includes a material having heat-increased oxidizing power to obtain a heated solvent; and discharging the heated solvent onto the silicon-bearing organic solvent film having a planarised upper surface, wherein the heated solvent dissolves organic components in the silicon-bearing organic solvent film while at least silicon in the silicon-bearing organic solvent film remains, and the silicon that remains undergoes liquid phase oxidation by the heated solvent.

With the above structure for the organic light-emitting element, when the planarization film is formed as a silicon oxide monolayer, a silicon-bearing organic solvent is first applied to an upper portion of the TFT layer, and the upper surface of the silicon-bearing organic solvent is then planarised with a predetermined liquid phase film formation method (e.g., spin coat, slit coat, or dip method) (Step 1). Accordingly, the upper surface of the silicon-bearing organic solvent that latter becomes the planarization film is planarised. Therefore, the organic light-emitting element pertaining to one aspect of the disclosure is formed with a planarization film having a planarised upper surface, despite the planarization film being formed of silicon (i.e., an inorganic material) and despite a bottom part of the planarization film being formed in conformity with irregularities in the upper surface of the TFT layer.

Next, for the organic light-emitting element pertaining to an aspect of the disclosure, a predetermined solvent that includes a material with heat-increased oxidizing power is discharged onto a silicon-bearing organic solvent having a planarised upper surface. Accordingly, organic components included in the silicon-bearing organic solvent are dissolved, and the silicon in the silicon-bearing organic solvent is oxidized into silicon oxide. As a result, the planarization film is formed as a silicon oxide monolayer.

The silicon oxide monolayer planarization film is inorganic, serves as an insulator, and is strongly water repellent. Thus, when the organic EL layer is formed after the planarization film formation process, no expansion or contraction of the planarization film occurs despite the application of water and heat. As a result, for the organic light-emitting element pertaining to an aspect of the disclosure, the planarization film is not shifted in any direction during the organic EL layer formation, and the upper surface of the planarization film maintains planarity.

According to the above-described method, although the planarization film includes an inorganic material (i.e., silicon oxide), the upper surface of the planarization film retains planarity during the organic EL layer formation after the planarization film formation. Thus, the planarization film is prevented from shifting in any direction, and the upper surface of the planarization film remains planar.

Accordingly, the organic light-emitting element pertaining to the aspect has superb light-emitting properties and a long useful life.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIGS. 5A and 5B are cross-sectional end view diagrams each schematically illustrating a portion of the display panel 10.

FIG. 7 is an overall diagram schematically representing the configuration of a device used in one portion of the display panel 10 manufacturing step.

FIG. 8 is an overall diagram schematically representing the configuration of a device used in one portion of the display panel 10 manufacturing step.

FIGS. 12A, 12B, and 12C are schematic diagrams respectively illustrating change in film thickness as the liquid phase oxidation film is formed.

FIGS. 17A and 17B are cross-sectional end views schematically illustrating a portion of a display panel pertaining to conventional technology.

DETAILED DESCRIPTION

Overview

Figure 1:
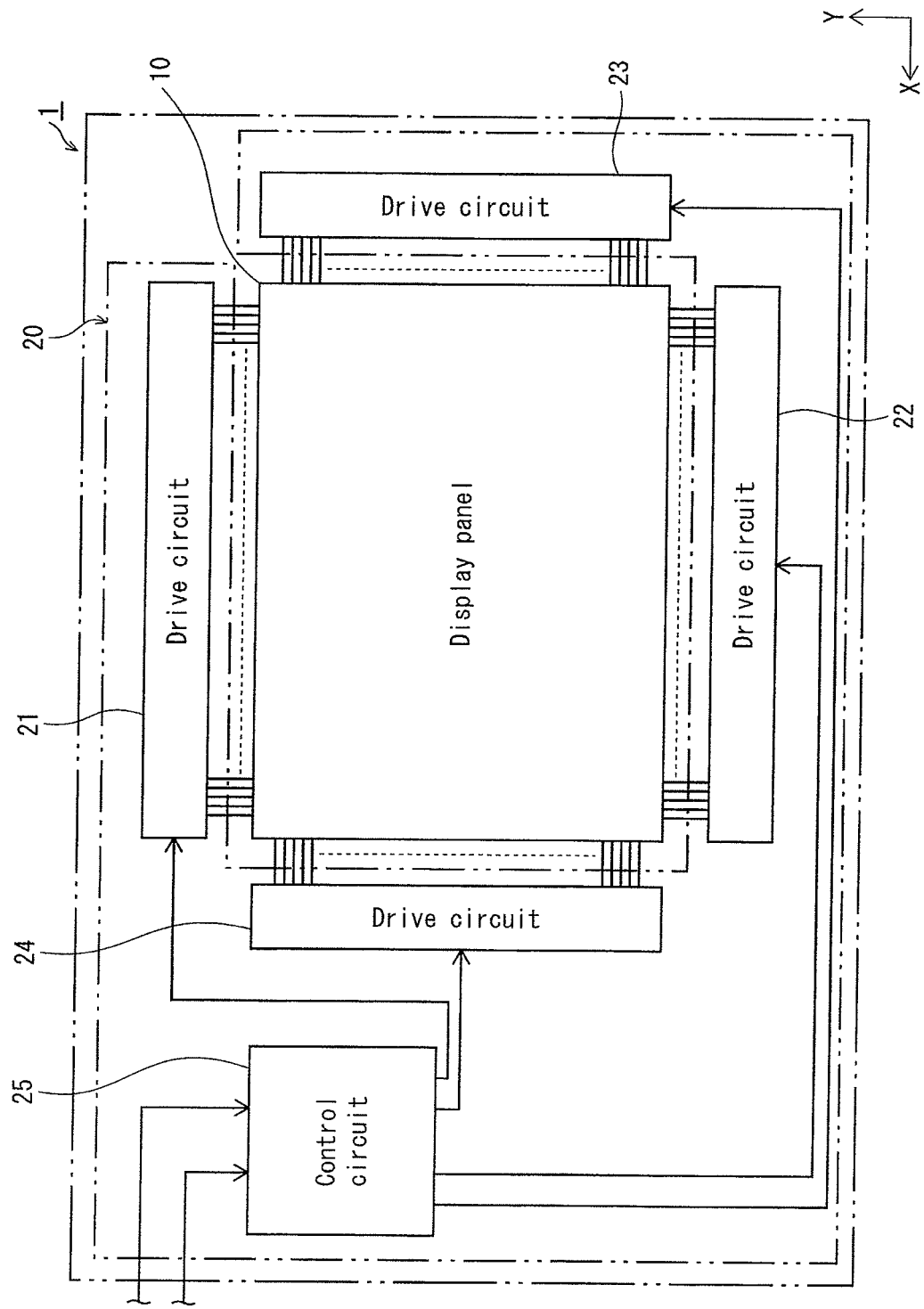
FIG. 1 is a block diagram schematically illustrating the configuration of a display device 1 pertaining to an Embodiment.

An organic light-emitting element pertaining to one aspect of the disclosure comprises: an organic EL layer including a pair of electrodes and an organic light-emitting layer disposed between the pair of electrodes; a TFT layer formed below the organic EL layer, being electrically connected to one electrode of the pair of electrodes, and causing the organic EL layer to emit light; and a planarization film disposed between the organic EL layer and the TFT layer, planarizing irregularities in an upper portion of the TFT layer such that the organic EL layer is formed over a planarised surface.

The planarization film is made up of a silicon oxide monolayer, and the planarization film made up of the silicon oxide monolayer is formed through: using a predetermined liquid phase film formation method to apply a silicon-bearing organic solvent to the upper portion of the thin-film transistor layer and to planarize an upper surface of the silicon-bearing organic solvent, thus forming a silicon-bearing organic solvent film; heating a predetermined solvent that includes a material having heat-increased oxidizing power to obtain a heated solvent; and discharging the heated solvent onto the silicon-bearing organic solvent film having a planarised upper surface, the heated solvent dissolving organic components in the silicon-bearing organic solvent film while at least silicon in the silicon-bearing organic solvent film remains, and the silicon that remains undergoes liquid phase oxidation by the heated solvent.

With the above structure for the organic light-emitting element, when the planarization film is formed as a silicon oxide monolayer, a silicon-bearing organic solvent is first applied to an upper portion of the TFT layer, the upper surface of the silicon-bearing organic solvent is then planarised with a predetermined liquid phase film formation method (e.g., a spin coat method, a slit coat method, or a dip method), and a film of silicon-bearing organic solvent is formed (Step 1). Accordingly, the upper surface of the film of the silicon-bearing organic solvent that later becomes the planarization film is planarised. Therefore, the organic light-emitting element pertaining to the one aspect of the disclosure is formed with a planarization film having a planarised upper surface, despite the planarization film being formed of silicon (i.e., an inorganic material) and despite a bottom part of the planarization film being formed in conformity with irregularities in the upper surface of the TFT layer.

Next, for the organic light-emitting element pertaining to the one aspect of the disclosure, a predetermined solvent that includes a material with heat-increased oxidizing power is discharged onto a silicon-bearing organic solvent having a planarised upper surface. Accordingly, organic components included in the silicon-bearing organic solvent are dissolved, and the silicon in the silicon-bearing organic solvent is oxidized into silicon oxide. As a result, the planarization film is formed as a silicon oxide monolayer.

The silicon oxide monolayer planarization film is inorganic, serves as an insulator, and is strongly water repellent. Accordingly, when the organic electroluminescence layer (hereinafter, organic EL layer) is formed after the planarization film formation process, no expansion or contraction of the planarization film occurs despite the application of water and heat. As a result, for the organic light-emitting element pertaining to an aspect of the disclosure, the planarization film is not shifted in any direction during the organic EL layer formation, and the upper surface of the planarization film maintains planarity.

According to the above-described method, although the planarization film includes an inorganic material (i.e., silicon oxide), the upper surface of the planarization film retains planarity during the organic EL layer formation after planarization film formation. Thus, the planarization film is prevented from shifting in any direction, and the upper surface of the planarization film remains planar.

Accordingly, the organic light-emitting element pertaining to the aspect has superb light-emitting properties and a long useful life.

In a further aspect of the one aspect of the disclosure, the heating of the predetermined solvent is performed by combining a first solvent and a second solvent into a mixture, and then heating the mixture to a predetermined temperature.

In another aspect of the further aspect of the disclosure, the heating of the mixture to the predetermined temperature is performed by combining the first solvent and the second solvent in a common container and heating the common container.

In an alternate aspect of the disclosure, the heating of the mixture to the predetermined temperature is performed by supplying the first solvent to a chemical combiner through a first supply line, supplying the second solvent to the chemical combiner through a second supply line, and combining the first solvent and the second solvent in the chemical combiner such that the mixture is heated through chemical reaction of the first solvent with the second solvent.

In yet a further aspect of the disclosure, at least one of the first solvent and the second solvent is heated before the first solvent and the second solvent are combined in the chemical combiner.

In yet another aspect of the disclosure, the planarization film made up of the silicon oxide monolayer contains carbon atoms. That is, in the organic light-emitting element pertaining to an aspect of the disclosure, the planarization film is formed through the above-described steps. However, substantial expansion and contraction due to water is prevented despite any remaining traces of carbon atoms in the layer.

In a further alternate aspect of the disclosure, the silicon-bearing organic solvent has a silicon content of no less than 20 wt % and no more than 40 wt %. As such, when the silicon content of the silicon-bearing organic solvent is no less than 20 wt % and no more than 40 wt %, the upper surface of the planarization film has superb planarity.

In yet a further alternate aspect of the disclosure, the material having heat-increased oxidizing power included in the predetermined solvent is peroxymonosulfuric acid ($H_2SO_5$). Also, the peroxymonosulfuric acid ($H_2SO_5$) is produced by combining sulfuric acid and aqueous hydrogen peroxide.

The sulfuric acid is combined with the aqueous hydrogen peroxide, thereby producing peroxymonosulfuric acid ($H_2SO_5$), and the oxidation power increases. Therefore, the organic components of the silicon-bearing organic solvent applied to the top portion of the TFT layer are dissolved, and the silicon is oxidized to produce silicon oxide. As such, the combination of the sulfuric acid and the aqueous hydrogen peroxide is a beneficial approach to the forming of the silicon oxide film.

Thus, the organic light-emitting element pertaining to an aspect of the disclosure has a planarization film that is a silicon oxide monolayer, and although the planarization film is formed from an inorganic material, the upper surface of the planarization film retains planarity during the organic EL layer formation after the planarization film formation. Thus, the planarization film is prevented from shifting in any direction, and the upper surface of the planarization film remains planar.

Accordingly, the organic light-emitting element pertaining to an aspect of the disclosure has superb characteristics and high reliability.

In still a further alternate aspect of the disclosure, the peroxymonosulfuric acid ($H_2SO_5$) is produced by sulfuric acid electrolysis. Thus, the above-described effects are produced despite the peroxymonosulfuric acid being used in formation.

In a further additional aspect of the disclosure, the heat is increased by raising a temperature to no less than 130° C. and no more than 160° C. Thus, when the above-described predetermined solvent is raised to a temperature that is no less than 130° C. and no more than 160° C. (e.g., to 150° C.), the sulfuric acid ($H_2SO_4$) combined with the aqueous hydrogen peroxide more easily reacts to produce the peroxymonosulfuric acid ($H_2SO_5$). Thus, the oxidation power is improved, the formation of silicon oxide by oxidizing the silicon is facilitated, and the planarization film formed as a silicon oxide monolayer has qualities equivalent to a thermal silicon oxide film formed through thermal oxidation.

As a result, the organic light-emitting element pertaining to an aspect of the disclosure has a planarization film formed as a fine silicon oxide monolayer, superb characteristics, and great reliability.

In an additional alternative aspect of the disclosure, the upper portion of the thin-film transistor layer has a protective film of a silicon-based material formed thereon, and the planarization film is formed over the protective silicon film. The organic light-emitting element pertaining to an aspect of the disclosure has a protective film of a silicon-based material (e.g., a protective film made of silicon nitride) formed over a top portion of the TFT layer. However, the protective silicon film is etched by the aforementioned predetermined solvent, namely the peroxymonosulfuric acid, thus producing a thinner film without altering the film shape through oxidation.

In an additional further aspect of the disclosure, the predetermined liquid phase film formation method is one of a spin coat method and a slit coat method.

In one aspect, a display panel pertaining to the disclosure comprises the organic light-emitting element pertaining to the disclosure. Accordingly, a display panel pertaining to an aspect of the disclosure uses effects identical to those of the organic light-emitting element pertaining to above-described aspect of the disclosure. In one aspect, a display device pertaining to the disclosure comprises the display panel pertaining to the disclosure. Thus, the display device pertaining to an aspect of the disclosure also has the above-described effects.

In one aspect, an organic light-emitting device manufacturing method comprises forming a TFT layer, forming a planarization film planarizing irregularities in a top portion of the TFT layer, and forming a pair of electrodes and an organic EL layer on a planarised upper surface of the planarization film, the organic EL layer including an organic light-emitting layer disposed between the pair of electrodes, and one electrode of the pair of electrodes being electrically connected to the TFT layer Here, the planarization film is made up of a silicon oxide monolayer. Then, the forming of the planarization film made up of the silicon oxide monolayer involves: using a predetermined liquid phase film formation method to apply a silicon-bearing organic solvent to the upper portion of the TFT layer and to planarize an upper surface of the silicon-bearing organic solvent, thus forming a silicon-bearing organic solvent film; heating a predetermined solvent that includes a material having heat-increased oxidizing power to obtain a heated solvent; and discharging the heated solvent onto the silicon-bearing organic solvent film having a planarised upper surface, the heated solvent dissolving organic components in the silicon-bearing organic solvent film while at least silicon in the silicon-bearing organic solvent film remains, such that the silicon that remains undergoes liquid phase oxidation by the heated solvent.

With the manufacturing method for the organic light-emitting element pertaining to an aspect of the disclosure, when the planarization film is formed as a silicon oxide monolayer, a silicon-bearing organic solvent is first applied to an upper portion of the TFT layer, the upper surface thereof is then planarised with, for example, a spin coat method, and a film of silicon-bearing organic solvent is formed. Therefore, the planarization film formed in later steps is formed of an inorganic material, and an upper surface of the planarization film is planarised despite a bottom part of the planarization film being formed in conformity with irregularities in the upper surface of the TFT layer.

Next, in the manufacturing method for an organic light-emitting element pertaining to an aspect of the disclosure, a predetermined solvent that includes a material with heat-increased oxidizing power (alternatively, with an oxidizing power that increases with raised heat and with oxidation) is discharged onto a silicon-bearing organic solvent having a planarised upper surface. This involves discharging the heated solvent onto the silicon-bearing organic solvent film having a planarised upper surface, the heated solvent dissolving organic components in the silicon-bearing organic solvent film while at least silicon in the silicon-bearing organic solvent film remains, such that the silicon that remains undergoes liquid phase oxidation by the heated solvent. Thus, the organic components in the silicon-bearing organic solvent film are dissolved, and the silicon in the silicon-bearing organic solvent remains in liquid phase oxidized form.

As a result, in the manufacturing method for an organic light-emitting element pertaining to an aspect of the disclosure, a planarization film that is a silicon oxide monolayer is formed over the TFT layer through the above-described steps. The silicon oxide monolayer planarization film is made of inorganic material, and thus serves as an insulator while being highly resistant to water. Thus, in the forming of the organic EL layer after forming the planarization film, any water or heat used in the process does not cause the planarization film to expand or contract. Accordingly, while forming the organic EL layer, the planarization film does not shift in any direction, and maintains planarity.

Thus, the manufacturing method for an organic light-emitting element pertaining to an aspect of the disclosure has a planarization film that is formed from an inorganic material, the upper surface of the planarization film retains planarity, and, after planarization film formation, the planarization film is prevented from shifting in any direction and the upper surface of the planarization film remains planar while the organic EL layer is being formed.

In an alternate manufacturing method pertaining to the disclosure, the heating of the predetermined solvent is performed by combining a first solvent and a second solvent into a mixture, and then heating the mixture to a predetermined temperature.

In another aspect of the manufacturing method pertaining to the disclosure, heating the mixture to the predetermined temperature is performed by combining the first solvent and the second solvent in a common container and heating the common container.

In an alternate aspect of the manufacturing method pertaining to the disclosure, heating the mixture to the predetermined temperature is performed by supplying the first solvent to a chemical combiner through a first supply line, supplying the second solvent to the chemical combiner through a second supply line, and combining the first solvent and the second solvent in the chemical combiner such that the mixture is heated through chemical reaction of the first solvent with the second solvent.

In yet a further aspect of the manufacturing method pertaining to the disclosure, at least one of the first solvent and the second solvent is heated before the first solvent and the second solvent are combined in the chemical combiner.

In still yet a further aspect of the manufacturing method pertaining to the disclosure, the silicon-bearing organic solvent has a silicon content of no less than 20 wt % and no more than 40 wt %. As such, when the silicon content of the silicon-bearing organic solvent is no less than 20 wt % and no more than 40 wt %, the upper surface of the planarization film has superb planarity.

In a further alternate aspect of the manufacturing method pertaining to the disclosure, the material having heat-increased oxidizing power included in the predetermined solvent is peroxymonosulfuric acid ($H_2SO_5$). Also, the peroxymonosulfuric acid ($H_2SO_5$) is produced by combining sulfuric acid and aqueous hydrogen peroxide. Alternatively, the peroxymonosulfuric acid ($H_2SO_5$) is produced by sulfuric acid electrolysis.

The sulfuric acid is combined with the aqueous hydrogen peroxide, thus producing peroxymonosulfuric acid ($H_2SO_5$), and the oxidation power increases. Therefore, the organic components of the silicon-bearing organic solvent applied to the top portion of the TFT layer are dissolved, and the silicon is oxidized to produce silicon oxide. Thus, the combination of the sulfuric acid and the aqueous hydrogen peroxide is a beneficial approach to forming the silicon oxide film.

Thus, in the manufacturing process for an organic light-emitting element pertaining to an aspect of the disclosure, a planarization film is formed as a silicon oxide monolayer, and although the planarization film is formed from an inorganic material, the upper surface of the planarization film retains planarity. Also, the planarization film is prevented from shifting in any direction during the forming of the organic EL layer after forming the planarization film.

As a result, in the manufacturing method for a organic light-emitting element pertaining to an aspect of the disclosure, the planarization film is formed as a fine silicon oxide monolayer, and a organic light-emitting element is manufactured that has superb characteristics and great reliability.

In another aspect of a manufacturing method pertaining to the present disclosure, the heat is increased by raising a temperature to no less than 130° C. and no more than 160° C. Thus, when the above-described predetermined solvent is raised to a temperature that is no less than 130° C. and no more than 160° C. (e.g., to 150° C.), the sulfuric acid ($H_2SO_4$) combined with the aqueous hydrogen peroxide more easily reacts to produce the peroxymonosulfuric acid ($H_2SO_5$). Accordingly, the oxidation power is improved, the formation of silicon oxide by oxidizing the silicon is facilitated, and the planarization film formed as a silicon oxide monolayer has qualities equivalent to a thermal silicon oxide film formed through thermal oxidation.

As a result, in the manufacturing method for the organic light-emitting element pertaining to an aspect of the disclosure, a planarization film is formed as a fine silicon oxide monolayer, and a organic light-emitting element having superb characteristics and great reliability is manufactured.

Also, the organic light-emitting device manufacturing method may further comprise: additionally forming a protective film of a silicon-based material over the top portion of the thin-film transistor layer, performed between the forming of the thin-film transistor layer and the forming of the planarization film, wherein the planarization film is formed over the protective silicon film. The manufacturing method for an organic light-emitting element pertaining to an aspect of the disclosure has a protective film of a silicon-based material (e.g., a protective film made of silicon nitride) formed over a top portion of the TFT layer, and has the planarization film formed thereover. As such, in the forming of the planarization film, the protective film is etched by the aforementioned predetermined solvent, namely the peroxymonosulfuric acid, thus producing a thinner film without altering the film shape through oxidation. That is, the protective silicon film protects the TFT layer during processing with the above-described solvent.

Accordingly, in the manufacturing method for a organic light-emitting element pertaining to an aspect of the disclosure, the TFT layer is protected against deterioration. Also, a silicon oxide monolayer planarization film is formed, providing a organic light-emitting element with superb characteristics.

In an additional further aspect of the manufacturing method pertaining to the disclosure, the predetermined liquid phase film formation method is one of a spin coat method and a slit coat method.

Embodiment

The following describes an Embodiment of the present disclosure by means of example.

The following Embodiment is used solely as an example selected for ease of comprehension with respect to the configuration, usage, and effects of the present disclosure. No particular limitation is intended.

1. Overview of Display Device 1

The following describes a display device 1 pertaining to the Embodiment with reference to FIG. 1.

As shown, the display device 1 includes a display panel 10 and a drive control unit 20 connected thereto. The display panel 10 is an organic electroluminescence panel (hereinafter, EL panel) employing the phenomenon of organic material electroluminescence, in which a plurality of organic EL elements are arranged.

The drive control unit 20 includes four drive circuits 21-24 and a control circuit 25.

In practice, no limitation is intended regarding the arrangement and connection relationship of the drive control unit 20 to the display panel 10 in the display device 1.

2. Configuration of Display Panel 10

Figure 2:
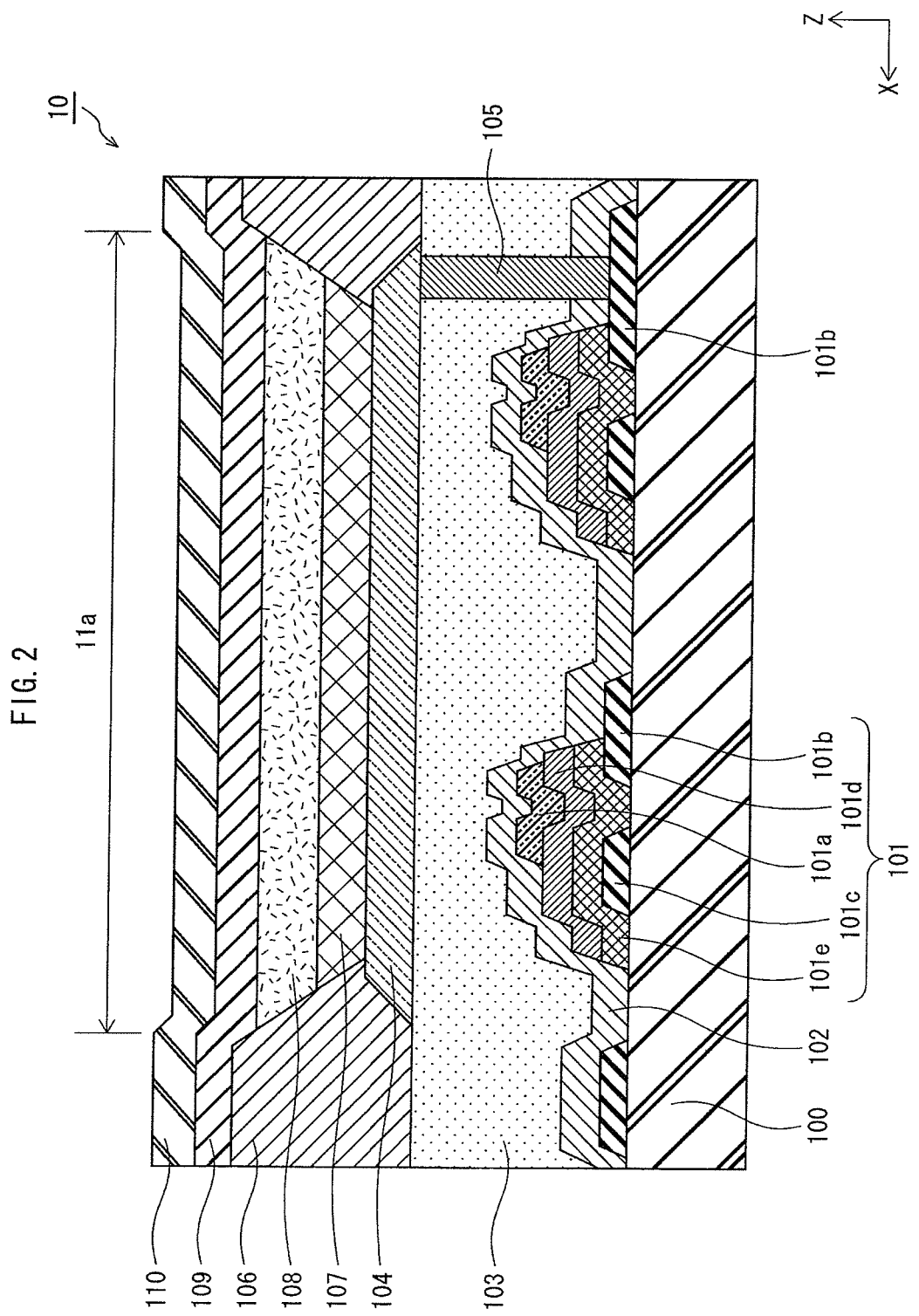
FIG. 2 is a cross-sectional end view diagram schematically illustrating a portion of a display panel 10.
Figure 3:
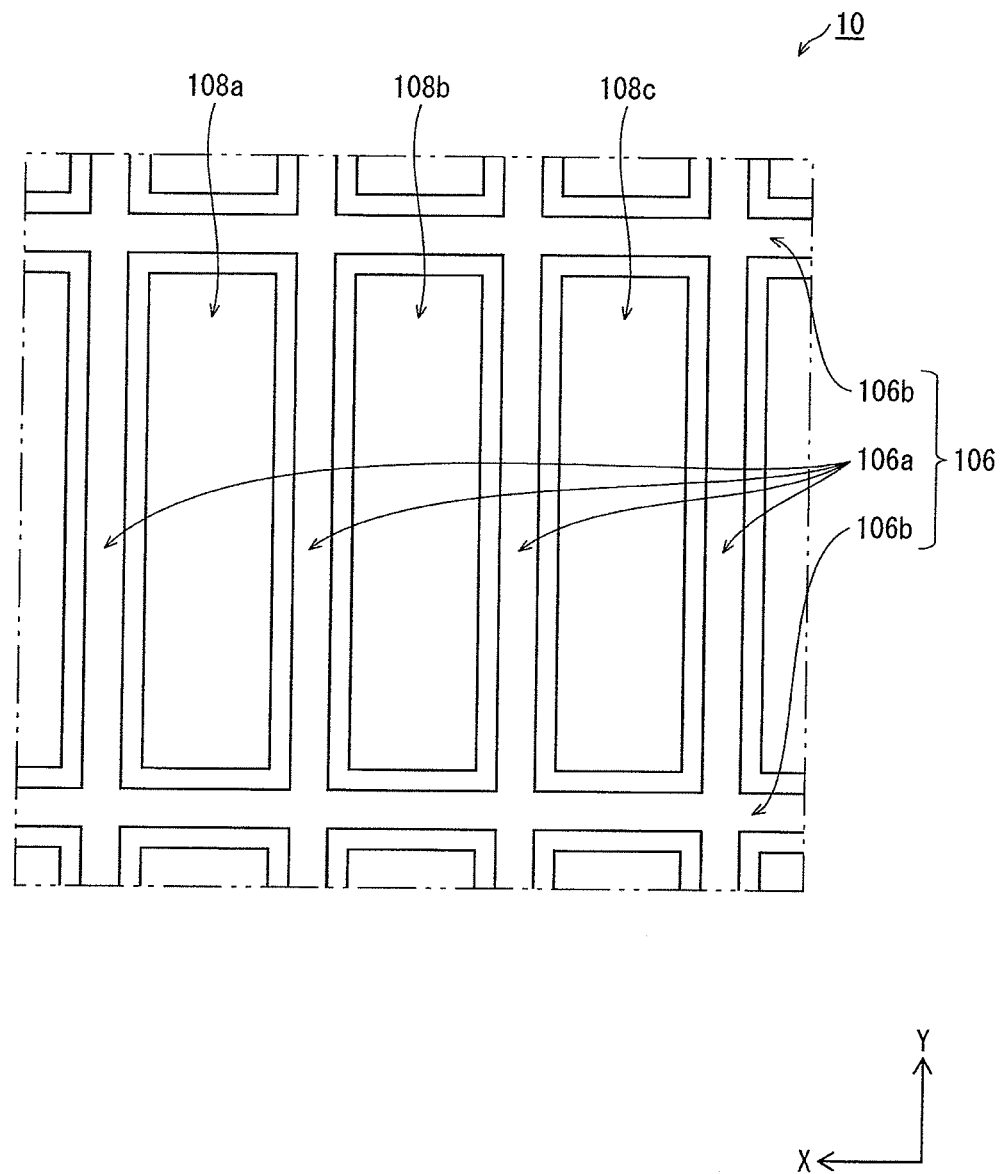
FIG. 3 is a schematic plane-view diagram illustrating the configuration of banks 106 in the display panel 10.

The configuration of the display panel 10 is described with respect to FIGS. 2 and 3. FIG. 2 shows a sub-pixel 11a, selected from among a plurality of sub-pixels making up the display panel 10. FIG. 3 shows three neighbouring the sub-pixels in the display panel 10.

The display panel 10 is a top emission organic EL display panel. As shown in FIG. 2, a substrate 100 has a TFT layer 101 layered thereon. A passivation film 102 is formed so as to cover the TFT layer 101, and a planarization film 103 is layered thereover. The TFT layer 101 includes a gate electrode 101a, a source electrode 101b, and a drain electrode 101c, as well as a gate insulation film 101d and a channel layer 101e.

The planarization film 103 is a single-layer liquid phase oxidation layer formed of silicon oxide. The formation method for the planarization film 103 is described later.

An anode 104 is formed above the planarization film 103 in the Z dimension, so as to correspond to the sub-pixel 11a. The anode 104 is electrically connected to the source electrode 101a of the TFT layer 101 through a contact plug 105 passing through the planarization film 103 in the Z dimension.

A hole injection layer 107 is layered above the anode 104 in the Z dimension, with an organic light-emitting layer 108 being further layered thereon. The organic light-emitting layer 108 is divided into units the size of the sub-pixel 11a by banks 106 disposed in correspondence with an upper face of the planarization film 103 and an upper face of an end of the anode 104.

As shown in FIG. 3, the banks 106 are formed of bank elements 106a, extending in the Y dimension, and bank elements 106b, extending in the X dimension. The organic light-emitting layers 108a, 108b, and 108c of the neighbouring sub-pixel are divided by the banks 106.

In the display panel 10, the three neighbouring sub-pixels correspond to emitted colours, namely red (R), green (G), and blue (B). The three neighbouring sub-pixels are grouped to form a single pixel.

As shown in FIG. 2, an electron transport layer 109 and a cathode 110 are layered above the organic light-emitting layer 108 in the Z dimension. Although not diagramed in FIG. 2, a sealing layer is also formed above the cathode 110.

The electron transport layer 109 and the cathode 110 extend beyond the regions defined by the banks 106, being formed continuously over the entire surface.

The following discusses an example where the organic EL layer includes the anode 104 and the cathode 110, the hole injection layer 107 interposed between the anode 104 and the cathode 110, the organic light-emitting layer 108, and the electron transport layer 109.

a) Substrate 100

The substrate 1 is, for example, made of a base that is an insulating material such as a non-alkali glass, a soda glass, a non-fluorescent glass, a phosphoric glass, a boric gas, quartz, an acrylic resin, a styrene resin, a polycarbonate resin, an epoxy resin, a polyethylene resin, a polyester resin, a silicone resin, aluminium oxide, and so on.

b) Planarization Film 103

As described above, the display panel 10 pertaining to the Embodiment has a planarization film 10 that is, for example, made of silicon oxide or a similar inorganic material.

c) Anode 104

The anode 104 is, for example, formed of silver (Ag), APC (an alloy of silver, palladium, and copper), ARA (an alloy of silver, rubidium, and gold), MoCr (an alloy of molybdenum and chrome), NiCr (an alloy of nickel and chrome), or similar. For a top emission organic EL display panel such as the present Embodiment, a material having high reflectivity is beneficial.

d) Hole Injection Layer 107

The hole injection layer 107 is, for example, formed using a metal oxide material such as $WO_X$ (tungsten oxide) or $MoWO_X$ (molybdenum tungsten oxide), or alternatively, using a metal nitride material or a metal oxide nitride material.

Aside from the metal oxide materials listed above, the hole injection layer 107 may also be formed of PEDOT (a compound of polythiophene and polystyrene sulfonate acid) or a similar conducting polymer material.

e) Organic Light-Emitting Layer 108

The organic light-emitting layer 108 emits light generated through the electrons recombining with injected holes and entering an excitation state. The material used for the organic light-emitting layer 108 is required to be an organic material having light-emitting properties that is used in a wet printing method.

Specifically, the organic material is beneficially one of the materials cited in Japanese Patent Application Publication No. 115-163488, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, rare earth metal complex, and so on.

f) Banks 106

The banks 106 are made of a resin or a similar organic material having insulating properties. The organic material used in the banks 106 may be an acrylic resin, a polyimide resin, a novolac-type phenol resin, or the like. The banks 106 are beneficially resistant to organic solvents. Further, processes such as etching and baking are applied to the banks 106. Consequently, a material with high resistance to deformation and transformation under these processes is desirable A fluoridation process may also be applied to the surface of the banks in order to impart repellency.

The insulating material used in the banks 106 may be any of the above-listed materials. In particular, a material with electrical resistivity equal to or greater than $10^5$ Ω·cm and with repellency is beneficial. The reason is that, when a material having electrical resistivity equal to or less than $10^5$ Ω·cm is used, the banks 106 cause leaked voltage between the anode 104 and the cathode 110 or between neighbouring elements. This leads to various problems, including increased power consumption.

Also, when the banks 106 are formed of a hydrophilic material, the difference in affinity/repellency between the surface of the banks 106 and the surface of the hole injection layer 107 is reduced. This leads to problematic complications in having openings in the banks 106 selectively retain ink that includes organic material, when forming the organic light-emitting layer 108.

Further, the configuration of the banks 106 is not limited to a single-layer structure as shown in FIG. 2. A dual-layer or multi-layer structure may also be employed. In such cases, the above-listed materials may be combined in different ways for each layer. Also, organic and inorganic materials may alternate layer-by-layer.

g) Electron Transport Layer 109

The electron transport layer 109 serves to transport electrons injected from the cathode 110 to the organic light-emitting layer 108. The material used may be OXD (an oxadiazole derivative), TAZ (a triazole derivative), BCP (a phenanthroline derivative), or similar.

h) Cathode 110

The cathode 110 is, for example, formed using a conductive material such as ITO or IZO (indium zinc oxide). The cathode 110 beneficially has an optical transmittance of 80% or higher.

Aside from the above, the material used for the cathode 110 may be, for example, an alkali metal, an alkali earth metal, or a structure in which a layer that includes one of these metals in halogenated form is laminated over a layer that includes silver. Here, the layer that includes silver may be made entirely of silver, or may be made of a silver alloy. In order to achieve improvements in light output efficacy, a refraction adjustment layer having high transparency may also be provided over the layer that includes silver.

i) Sealing Layer

Although not diagrammed in FIG. 2, the sealing layer serves to protect the organic layer of the organic light-emitting layer 108 and so on against ablation from moisture, from the atmosphere, and so on. The material for the sealing layer may be, for example, SiN (silicon nitride), SiON (silicon oxynitride), or similar. A material having transparency is beneficial for the top emission panel.

3. Manufacturing Method for Display Panel 10

A manufacturing method for the display panel 10 pertaining to the Embodiment is described with reference to FIGS.

4A and 4B through FIG. 8. The drawings mainly illustrate a formation step for the planarization film 103.

Figure 4A:
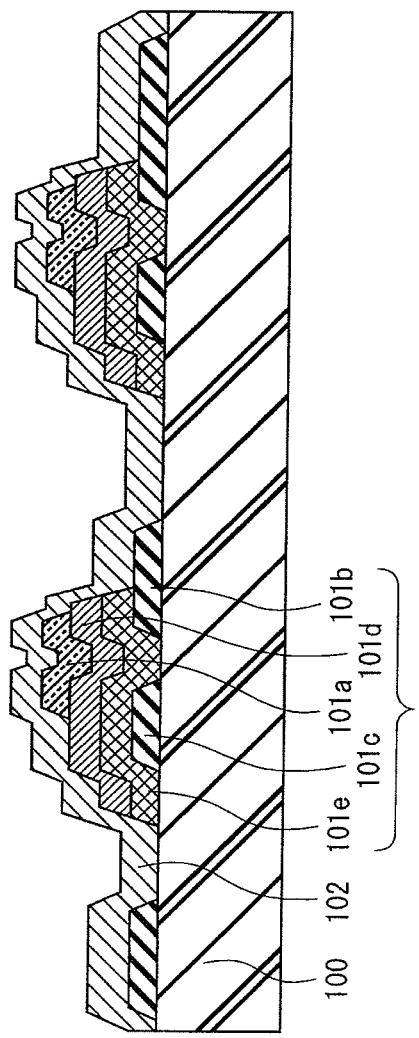
FIGS. 4A and 4B are cross-sectional end view diagrams each schematically illustrating a portion of the display panel 10.

FIG. 4A illustrates the formation of the TFT layer 101 and the passivation film 102 over the upper surface of the substrate 100 with respect to the Z dimension. The TFT layer 101 is formed by sequentially laminating the source electrode 101b, the drain electrode 101c, the channel layer 101e, and the gate electrode 101a in the stated order.

As shown, the upper surface of the TFT layer 101 with respect to the Z dimension has irregularities. The passivation film 102 covering the top of the TFT layer 101 also has irregularities, conforming to those of the TFT layer 101.

Figure 6A:
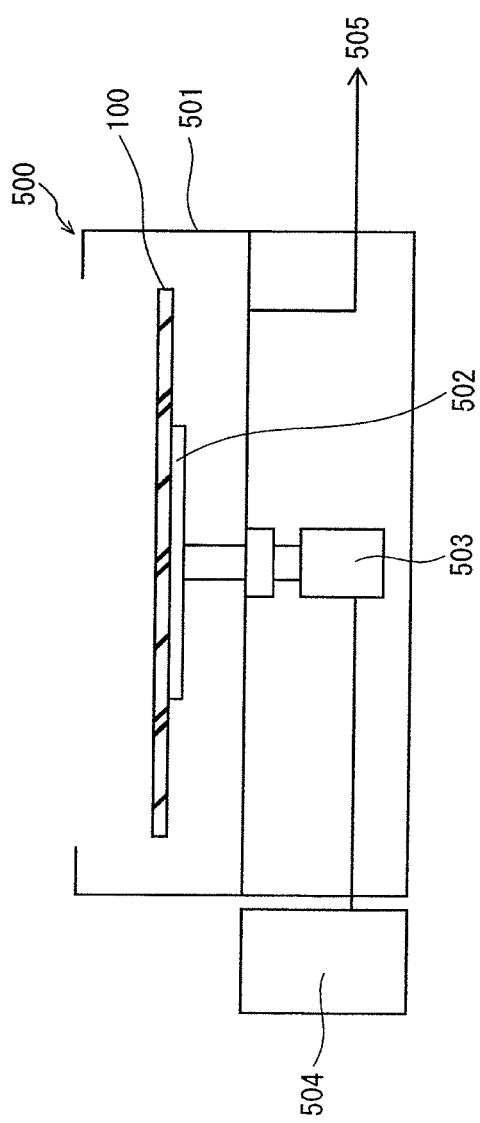
FIGS. 6A and 6B are overall diagrams schematically representing the configuration of a device used in one portion of a display panel 10 manufacturing step.

FIG. 6A shows the substrate 100 having the TFT layer 101 and the passivation film 102 layered thereon being placed on a turntable 502 that is part of a resist coating device 500. The resist coating device 500 also includes a motor 503 connected to the turntable 502, a controller 504 controlling the drive of the motor 503, an effluent line 505 for disposing of waste fluid, and a spin cup 501 supporting the turntable 502.

The TFT layer 101 and the passivation film 102 on the substrate 100 are omitted from FIG. 6A.

Figure 4B:
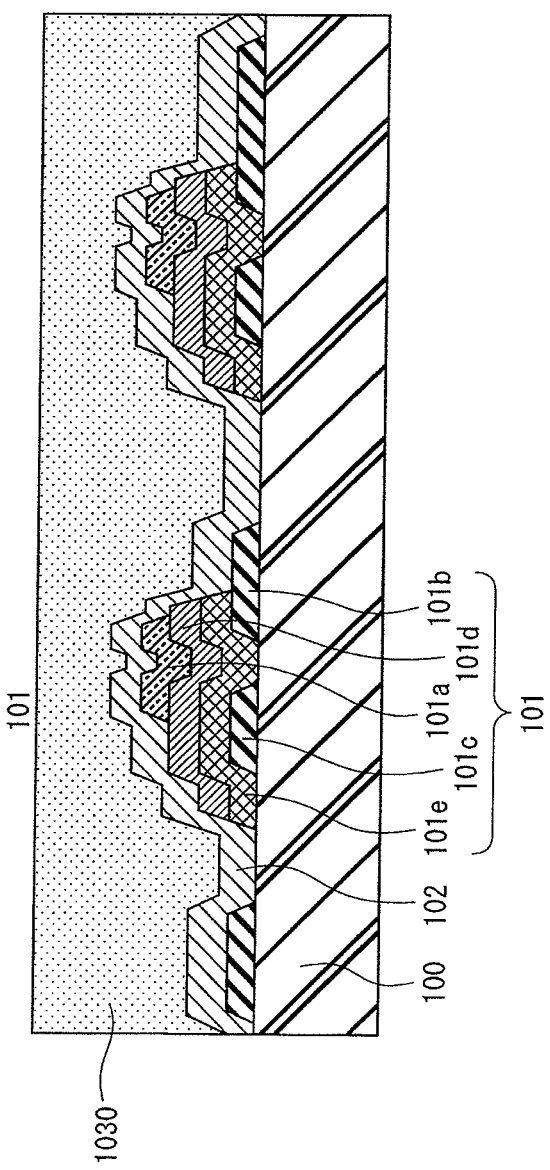
Figure 6B:
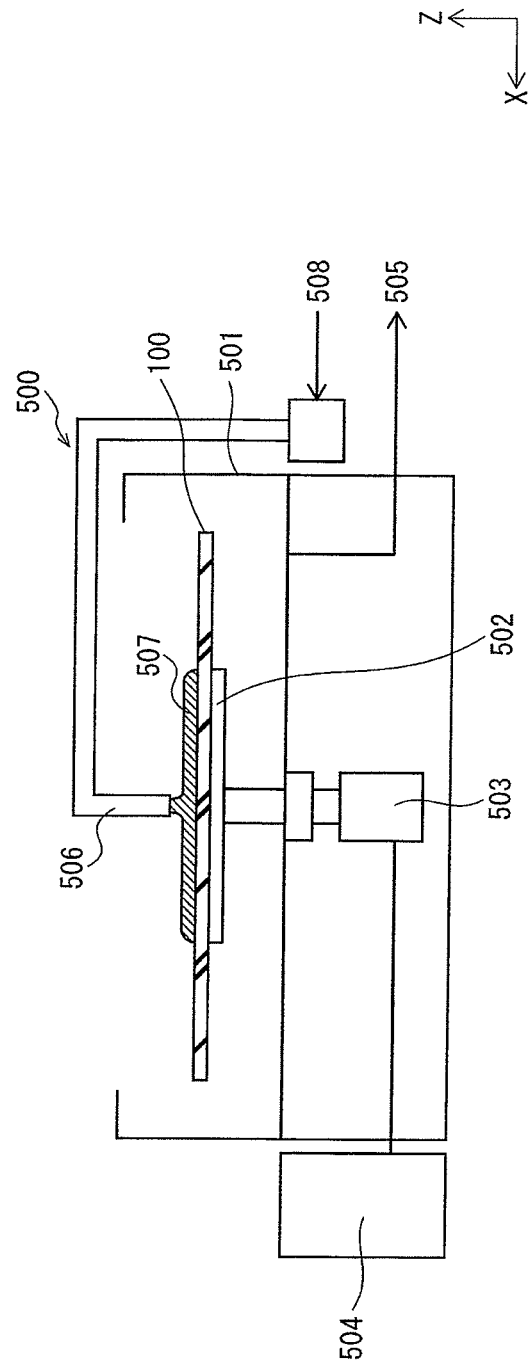

Next, as shown in FIG. 6B, a silicon-bearing organic solvent (e.g., organo siloxane) 507 is discharged, via a discharge nozzle 506, from a supply line 508 onto the upper surface of the substrate 100 (i.e., the surface on which the TFT layer 101 and the passivation film 102 are formed), which has been placed on the turntable 502. Then, as shown in FIG. 7, the surface of the silicon-bearing organic solvent 507 is planarised by spinning the turntable 502. Thus, as shown in FIG. 4B, a resist film 1030 is formed on the main surface of the substrate 100, on which the TFT layer 101 and the passivation film 102 are formed, having been planarised with respect to the Z dimension through the spin coat method.

The upper surface of the resist film 1030 with respect to the Z dimension is unaffected by the irregularities in the surface of the TFT layer 101 and the passivation film 102 therebeneath, being planarised through the spin coat method.

Next, as shown in FIG. 5A, a processing fluid 300 is discharged into the resist film 1030 from a planarised upper surface 1030f. The processing fluid 300 is a solvent including a material with oxidizing power that increases as a result of raised temperatures. Specifically, the material is peroxymonosulfuric acid ($H_2SO_5$) that has been heated to a temperature no lower than 130° C. and no higher than 160° C. (e.g., to 150° C.). As shown in FIG. 8, the processing fluid 300 (i.e., the heated peroxymonosulfuric acid ($H_2SO_5$)) is discharged onto the resist film 1030 by separately supplying sulfuric acid and aqueous hydrogen peroxide through a sulfuric acid supply line 511 and an aqueous hydrogen peroxide supply line 512, respectively, then combining the two ingredients in a chemical combiner 513 immediately prior to discharge from the discharge nozzle 510. The peroxymonosulfuric acid ($H_2SO_5$) resulting from this combination is then discharged onto the resist film 1030.

In the sulfuric acid supply line 511, the sulfuric acid is, for example, heated to as much as 80° C. Thus, the peroxymonosulfuric acid (i.e., the processing fluid 300) produced when the sulfuric acid so heated reacts with the aqueous hydrogen peroxide supplied by the aqueous hydrogen peroxide supply line 512 in the chemical combiner 513 increases in temperature to as much as 150° C. Thus, the processing fluid 300, being heated to a temperature no less than 130° C. and no more than 160° C., has strong oxidizing power.

As shown in FIG. 5B, once the processing fluid 300 is discharged onto the resist film 1030 as described above, the organic component of the resist film 1030, which is composed of a silicon-bearing organic solvent, is dissolved. Thus, the silicon in the resist film 1030 is oxidized, forming silicon oxide. Accordingly, the upper surface of the substrate 100, on which the TFT layer 101 and the passivation film 102 are formed, is covered by the planarization film 103, which is an inorganic silicon oxide monolayer.

As shown in FIG. 5B, an upper surface 103f of the planarization film 103 is lower in height by Δh relative to the planarised upper surface 1030f of the resist film 1030 prior to processing fluid 300 discharge. This is due to the dissolution of the organic components. However, the upper surface 103f of the planarization film 103 thus formed also retains high planarity, similar to the planarised upper surface 1030f of the resist film 1030 subject to the spin coat method.

The method of generating and heating the processing fluid 300, including the above, involves one of the following methods.

(i) Combine Sulfuric Acid, Aqueous Hydrogen Peroxide, and Water in a Heated Bathtub.

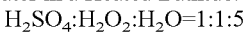
$H_2SO_4:H_2O_2:H_2O=1:1:5$

Bathtub heated to no less than 130° C. and no more than 160° C.

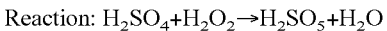
Reaction: $H_2SO_4 + H_2O_2 \rightarrow H_2SO_5 + H_2O$ (ii) Pre-Combination Method

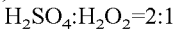
$H_2SO_4:H_2O_2=2:1$

Wafer pre-combination method: $H_2SO_4$ heated to 80° C., $H_2O_2$ at room temperature

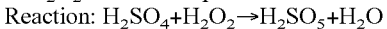
Reaction: $H_2SO_4 + H_2O_2 \rightarrow H_2SO_5 + H_2O$ (iii) Electrolysis Method

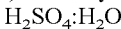
$H_2SO_4:H_2O$

Post-electrolysis, heat to no less than 100° C.

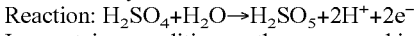
Reaction: $H_2SO_4 + H_2O \rightarrow H_2SO_5 + 2H^+ + 2e^-$

In certain conditions, the pre-combination method described as (ii) above is beneficial in that the dissolution speed of the organic components upon resist film 1030 discharge is faster in comparison to the method involving combination in a heated bathtub.

4. Liquid Phase Oxidation

As described above, the manufacturing method for the display panel 10 pertaining to the present Embodiment involves forming the planarization film 103 using liquid phase oxidation. Supplemental descriptions are provided with reference to FIGS. 9A through 9C.

Figure 9A:
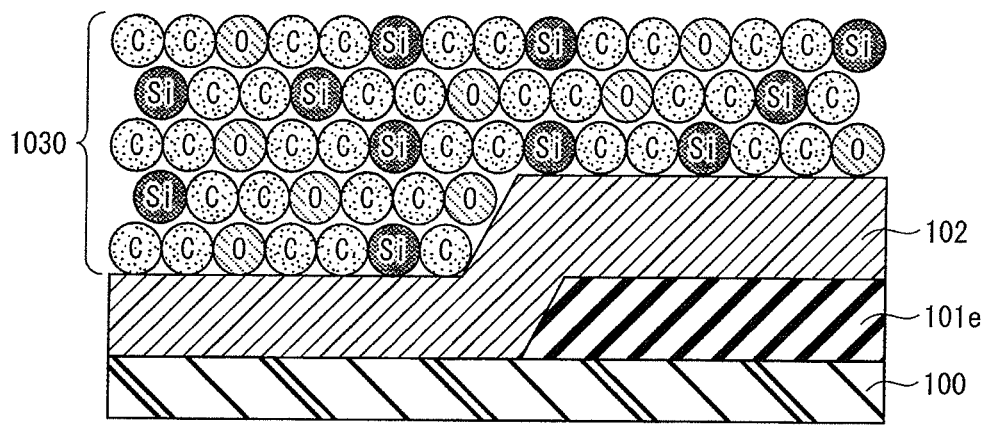
FIGS. 9A, 9B, and 9C are schematic diagrams indicating a planarization film 103 formation process as part of the display panel 10 manufacturing step.

FIG. 9A illustrates forming the resist film 1030, made from of silicon-bearing organic solvent, on the substrate 100 where the TFT layer 101 (shown only as the channel layer 101e in FIGS. 9A through 9C) and the passivation film 102 are formed using a liquid phase film formation method such as the spin coat method. The upper surface of the resist film 1030 is planarised.

Figure 9B:
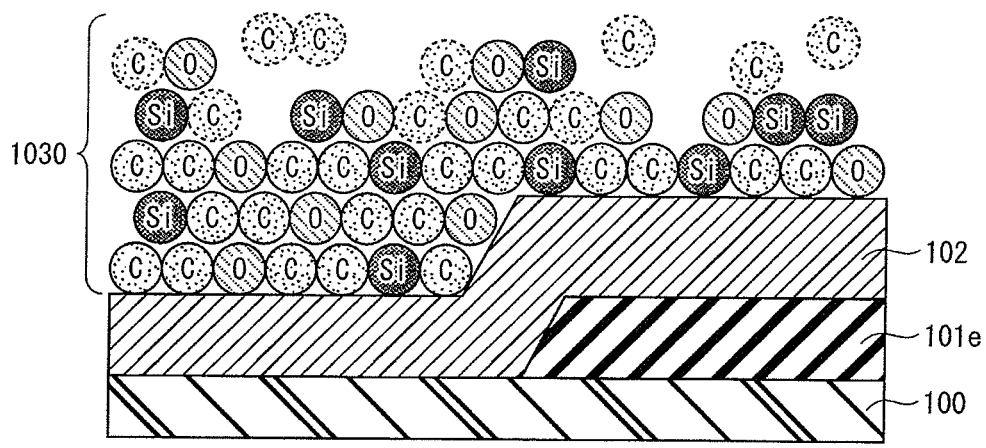

FIG. 9B illustrates the organic components (i.e., carbon, labeled C) dissolving as a result of the processing fluid 300, which is peroxymonosulfuric acid or similar, being discharged onto the resist film 1030.

Figure 9C:
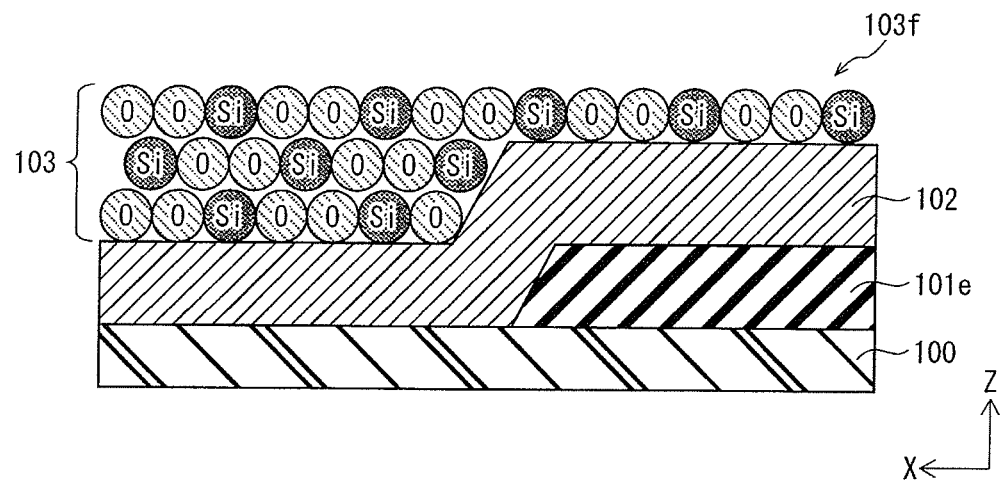

FIG. 9C illustrates the silicon oxide monolayer forming the planarization film 103 as a result of organic component dissolution and silicon oxidation. The upper surface 103f of the planarization film 103 retains planarity, as described above. Also, the substance of the planarization film 103 thus formed by discharging the processing fluid 300 of peroxymonosulfuric acid ($H_2SO_5$) contains no residual organic components and is thus an inorganic film.

5. Effects

Forming the silicon oxide monolayer planarization film 103 of the display panel 10 pertaining to the present Embodiment consists of first applying the silicon-bearing organic solvent 507 to the upper surface of the substrate 100 on which the TFT layer 101 and the passivation film 102 are formed (see FIG. 6B), and then forming the planarised resist film 1030 on the upper surface 1030f thereof using the spin coat method (see FIG. 4B). Therefore, the display panel 10 pertaining to the present Embodiment is formed with a planarization film 103 that has a planarised upper surface 103f, despite the planarization film 103 being formed from silicon oxide (i.e., an inorganic material) and despite the presence of irregularities in the upper surface of the TFT layer 101 and the passivation film 102 under the planarization film 103.

Next, for the display panel 10 pertaining to the present Embodiment, organic components included in the resist film 1030 are discharged onto the upper surface 1030f of the resist film 1030 by discharging a processing fluid 300 that includes material heated so as to increase the oxidizing power thereof (see FIGS. 5A and 8). Thus, the silicon in the resist film 1030 is oxidized, becoming silicon oxide. As a result, the planarization film 103 is formed as a silicon oxide monolayer (see FIG. 5B).

The silicon oxide monolayer planarization film 103 is inorganic, serves as an insulator, and is strongly water-resistant. Thus, when the organic EL layer (which includes the anode 104, the hole injection layer 107, the organic light-emitting layer 108, the electron transport layer 109, and the cathode 110) is formed after the planarization film 103 formation process, no shrinkage of the planarization film occurs despite the application of water and heat. As a result, during the organic EL layer formation step for the display panel 10 pertaining to the present Embodiment, the upper surface 103f of the planarization film 103 retains planarity and does not undergo shifting with respect to any of the Z, X, and Y dimensions.

According to the above, when the planarization film 103 is formed of an inorganic material (e.g., silicon oxide) as per the above-described method, the upper surface 103f of the planarization film 103 retains planarity and, during the organic EL layer formation step that follows the planarization film 103 formation step, the planarization film 103 is prevented from shifting in any direction. Thus, the display panel 10 has exceptional light-emitting properties and a long useful life.

6. Validation

Figure 10A:
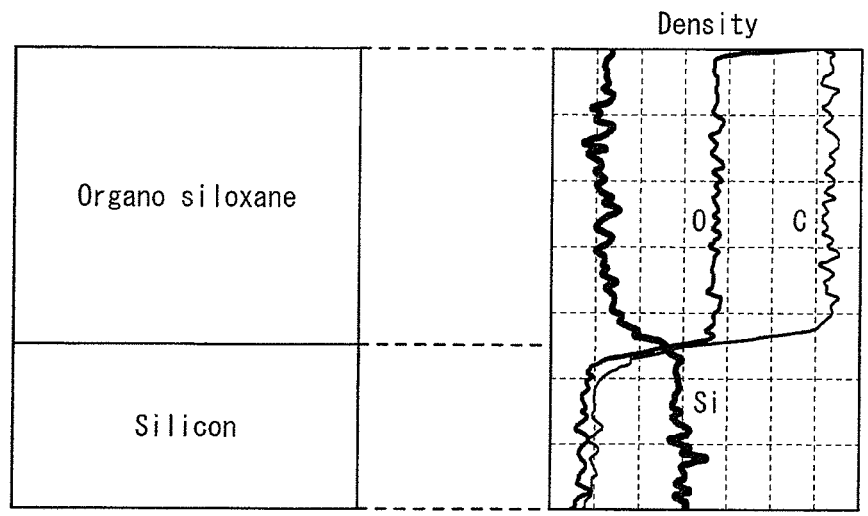
FIGS. 10A and 10B are schematics indicating the respective density distributions of silicon, oxygen, and carbon in organo siloxane and in a liquid phase oxidation film.

The planarization film 103 pertaining to the Embodiment has been validated as an inorganic film containing no substantial organic components. FIG. 10A indicates the respective densities of silicon, oxygen, and carbon as components of the organo siloxane on the silicon substrate, and FIG. 10B indicates the respective densities of silicon, oxygen, and carbon in the liquid phase oxidation method described above. Also, FIG. 11A indicates the respective densities of silicon, oxygen, and carbon as components of a comparative example where thermal oxidation is used to form the film on a silicon substrate, and FIG. 11B indicates the respective densities of silicon, oxygen, and carbon when liquid phase oxidation is further applied to the film formed through thermal oxidation on the silicon substrate. In FIGS. 10A, 10B, 11A, and 11B, the density graphs are drawn such that the horizontal axis indicates greater density toward the right-hand side, and the vertical axis corresponds to the position in the schematic on the left-hand side.

Figure 10B:
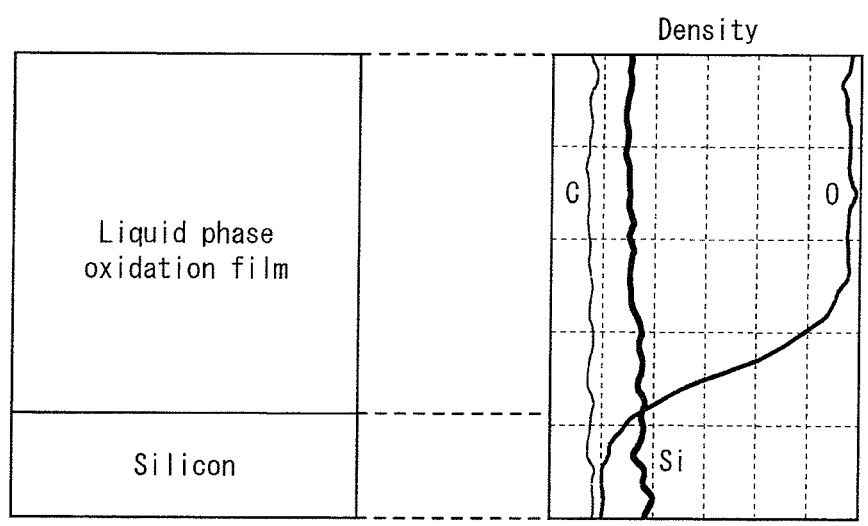

Firstly, as shown in FIG. 10B, the density of carbon is relatively high, in comparison to the silicon and oxygen densities, in the organo siloxane. In contrast, as shown in FIG. 10B, the planarization film 103 obtained through the liquid phase oxidation method by applying the processing fluid 300 to the peroxymonosulfuric acid contains very little carbon. Specifically, the carbon density is almost identical to that of the base silicon substrate. Accordingly, the planarization film 103 on the display panel 10 pertaining to the Embodiment is a substantially inorganic film of material containing no organic components.

Figure 11A:
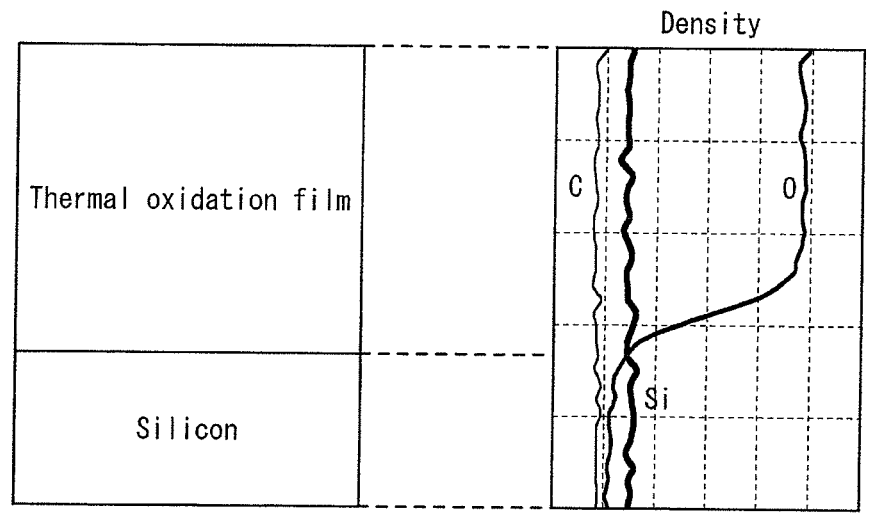
FIGS. 11A and 11B are schematics indicating the respective density distributions of silicon, oxygen, and carbon in a thermal oxidation film and in a liquid phase oxidation film laminated on a thermal oxidation film.

FIG. 11A indicates the respective densities of silicon, oxygen, and carbon in the thermal oxidation layer. In such a situation, thermal oxidation is employed as the formation method, such that in principle, no carbon atoms are introduced. However, comparison of the thermal oxidation film of FIG. 11A with the liquid phase oxidation film of FIG. 10B reveals that very few organic components (i.e., carbon atoms) remain in the latter.

Figure 11B:
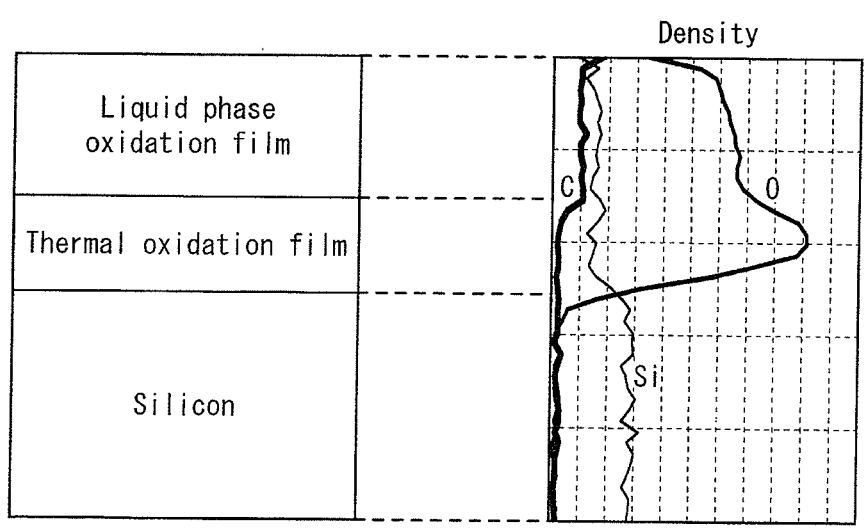

Also, as shown in FIG. 11B, the organic material (i.e., carbon) density in the film remains low enough to be comparable to the thermal oxidation film, despite the thermal oxidation film being formed on the silicon substrate and having the liquid phase oxidation film formed thereover.

According to the above, the planarization film 103 formed using the liquid phase film formation method pertaining to the Embodiment described above is clearly an inorganic film. A certain amount (i.e., an amount equivalent to contamination in the thermal oxidation film) of organic components remaining in the planarization film 103 is nevertheless acceptable. That is, when the organic EL layer is formed, the absorption of water or the application of heat may cause organic material to be left behind, but this is acceptable provided that no shifting occurs in the planarization film 103.

The following describes the planarization of the planarization film 103 formed through liquid phase oxidation. The following refers to FIGS. 12A, 12B, and 12C through FIGS. 14A and 14B.

FIG. 12A shows a LOCOS oxidation film formed on a silicon substrate, and a base material prepared thereon by forming a gate oxidation film. The film formed by gate oxidation has thickness $t_0$, and gap between the LOCOS-formed portion and other portions has width $g_0$. The present document supposes that the LOCOS of FIG. 12A forms irregularities in the upper surface of the TFT layer 101.

Figure 13A:
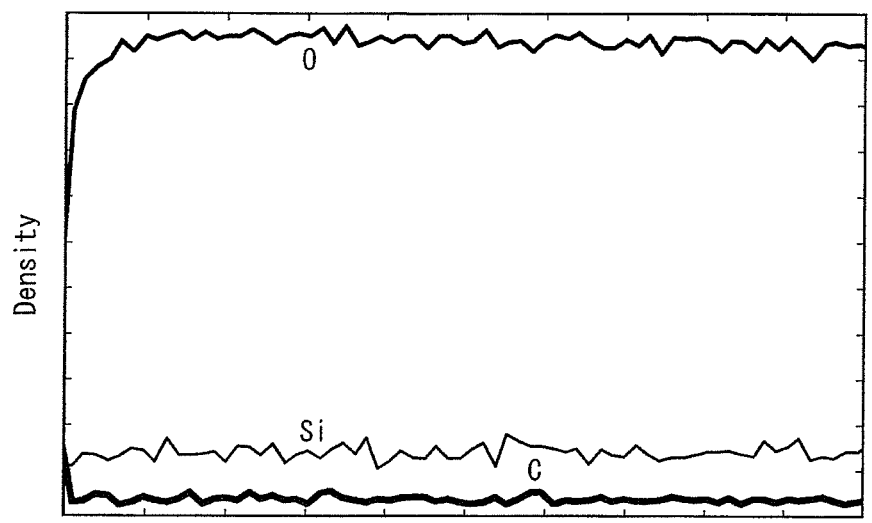
FIGS. 13A and 13B are schematic diagrams illustrating the respective density distributions of silicon, oxygen, and carbon in each portion indicated in FIGS. 12A, 12B, and 12C.
Figure 13B:
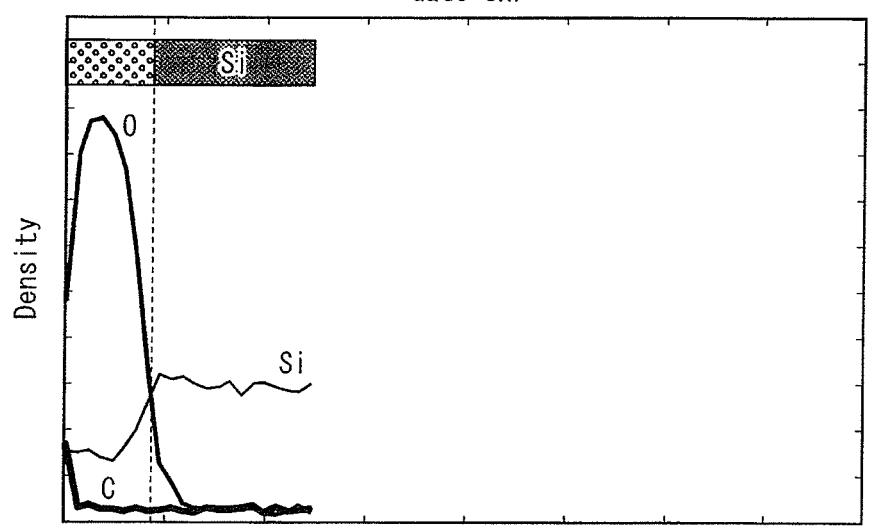

FIGS. 13A and 13B respectively indicate that, in the LOCOS oxidation film and the gate oxidation film, the oxygen density is highest while the carbon density is near-zero.

Next, FIG. 12B shows the application of the resist film (corresponding to the resist film 1030 of the above-described Embodiment) having added silicon and having thickness $t_1$ over the gate oxidation film, so as to form a resist film. In FIG. 12B, the thickness $t_1$ is thinner than the gap $g_0$. However, this is illustrated for validation purposes. When actually forming the planarization film 103, the resist film 1030 is necessarily formed so as to be thicker than the gap $g_0$.

Figure 14A:
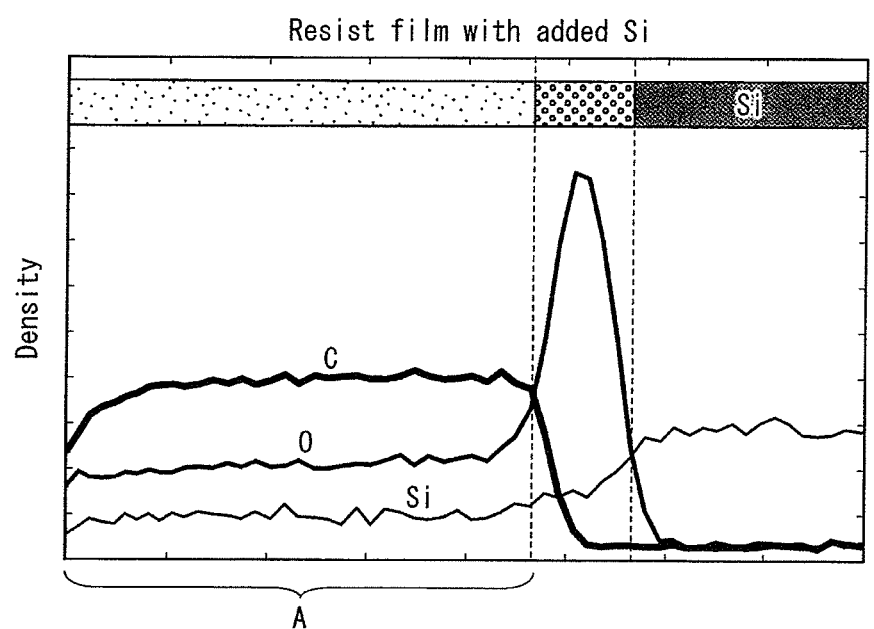
FIGS. 14A and 14B are schematic diagrams indicating the respective density distributions of silicon, oxygen, and carbon in a resist film having added Si (organo siloxane) and in a liquid phase oxidation film.
Figure 14B:
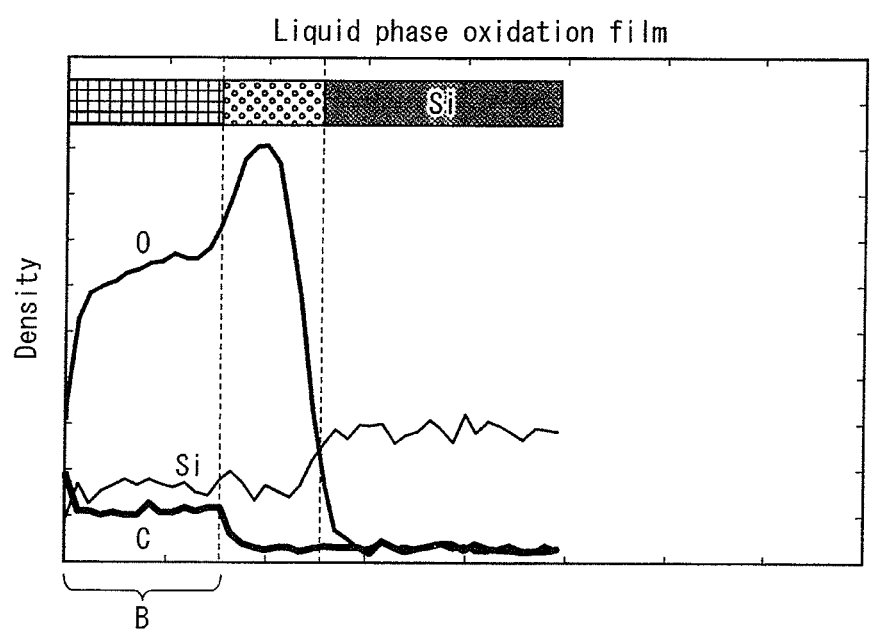

FIG. 14B shows that, within the resist film, the carbon density is higher than the silicon and oxygen densities due to the use of the organic solvent (see region A).

As described above, a predetermined solvent (e.g., peroxymonosulfuric acid ($H_2SO_5$)) is heated so as to increase the oxidation power thereof and applied to the resist film. Thus, as shown in FIG. 12C, a liquid phase oxidation film having thickness $t_2$ is formed. FIG. 14B indicates that, in the liquid phase oxidation film, the oxygen density is highest and the silicon density is second-highest. Also, given that the organic components are dissolved by the aforementioned predetermined solvent, the carbon density is extremely low. According to FIG. 14B, the liquid phase oxidation film formed using the above-described method is an inorganic film substantially containing no organic components (see region B).

In to the above Embodiment, the validation of the planarization film 103 planarity shows that, in the state illustrated by FIG. 12A, the gap has width $g_0$. However, in the state illustrated by FIG. 12C, the liquid phase oxidation film is formed with thickness $t_2$ in portions other than the top of the LOCOS portion. The liquid phase oxidation film is barely formed at all at the top of the LOCOS portion. Thus, in the state illustrated by FIG. 12C, the gap is obviously reduced to $(g_0-t_2)$.

In the validation section, as shown in FIG. 12B, the resist film having added silicon and thickness $t_1$ is formed. However, forming this film with a greater thickness enables the liquid phase oxidation film to cover the top of the LOCOS portion, and thus enables planarization over the entirety. When the resist film having added silicon has an upper surface that is planarised using the spin coat method or similar, the upper surface of the liquid phase oxidation film is also planarised and thus unaffected by the irregularities below.

According to the above, the planarization film 103 formed using liquid phase film formation does not conform to the irregularities of the upper surface of the TFT layer 101, and as such the upper surface 103f is planarised.

7. Silicon Content of Resist Film 1030

Figure 15:
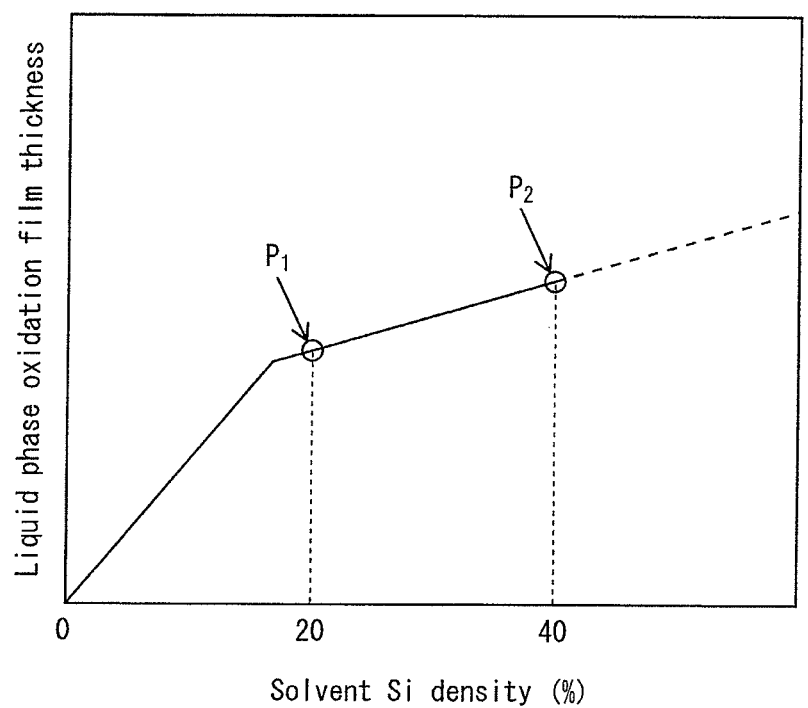
FIG. 15 is a schematic diagram illustrating the relationship between silicon density in a solvent and the thickness of the liquid phase oxidation film.

A beneficial range for the silicon content of the resist film 1030 is described with reference to FIG. 15. FIG. 15 indicates the relationship between silicon density and the thickness of the liquid phase oxidation film.

As shown, when the silicon density is less than 20 wt % (i.e., lower than point $P_1$), forming an even liquid phase oxidation film becomes difficult due to the low silicon density. When the silicon density is so low, the liquid phase oxidation film may, for example, take on an island form or be formed with great distortions.

Conversely, when the silicon density is greater than 40 wt % (i.e., higher than point $P_2$), even application is made impossible by the viscosity at application time being outside acceptable limits due to such high silicon density. Thus, when the silicon density is too high, the upper surface of the liquid phase oxidation film is unable to maintain planarity, and oblique portions may form.

Accordingly, the silicon density of the resist film is beneficially no less than 20 wt % and no more than 40 wt %.

Other Variations

In the above-described Embodiment, the display device 1 and the display panel 10 included therein are described by means of example. However, no limitation is intended. Another similar configuration for the organic light-emitting element may also be used to obtain the above-described effects. For example, the above-described configuration may be applied to an organic light-emitting element used in a lighting apparatus.

Figure 16:
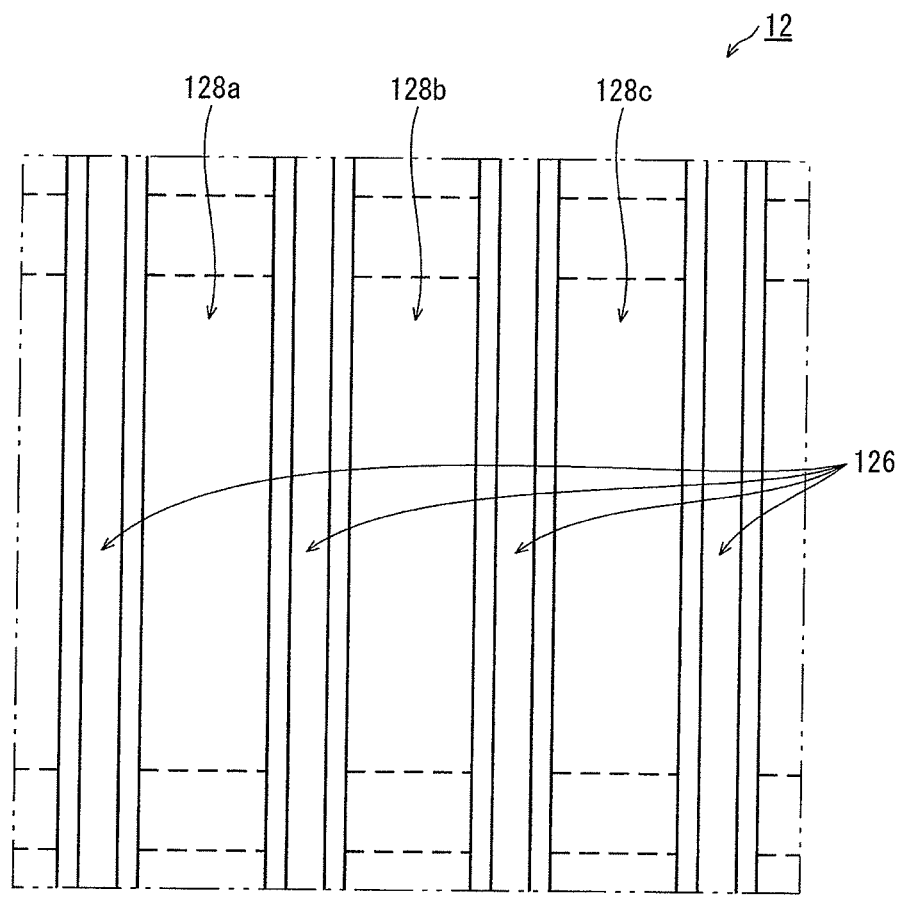
FIG. 16 is a schematic plane-view diagram illustrating the configuration of banks 126 in a variant display panel 12.

Also, in the above-described Embodiment, a pixel bank example is used in the configuration of the bank 106 as shown in FIG. 3. However, no limitation to the configuration of the bank is intended. For instance, as shown in FIG. 16, the banks (line banks) 126 may extend in the Y dimension and be parallel to one another. When such line banks are used, neighbouring sub-pixels 128a, 128b, and 128c are defined and usable for the configuration of the display panel 12.

Also, in the above-described Embodiment, the spin coat method is used as an example of a liquid phase film formation method. However, no limitation is intended. The slit coat method, the dip method, and other methods may also be employed.

Also, in the above-described Embodiment, the solvent (i.e., the processing fluid 300) that includes material with oxidizing power that increases with raised temperatures is peroxymonosulfuric acid ($H_2SO_5$). However, no limitation is intended. Any material having strong oxidizing power and including organic components that dissolve in a solvent may be used. For example, peroxodisulfuric acid ($H_2S_2O_8$) may be used.

Also, in the above Embodiment, the film made of silicon-bearing organic solvent is described as the resist film 1030. However, the aforementioned resist is not photosensitive.

Also, the aforementioned planarization film 103, which is a liquid phase oxidation film, effectively contains no remaining organic components. However, a tolerable level of organic components may remain as slight impurities therein. Specifically, no difficulty is presented by the C density being greater than that of a thermal oxidation film and organic components remaining at a level that has no great effect on water absorption.

INDUSTRIAL APPLICABILITY

A device of the present disclosure is applicable to realizing an organic light-emitting element having excellent light-emitting properties and high reliability.

REFERENCE SIGNS LIST

1 Display device
10 Display panel
11a Sub-pixel
20 Drive control unit
21-24 Drive circuits
25 Control circuit
100 Substrate
101 TFT layer
101a Gate electrode
101b Source electrode
101c Drain electrode
101d Gate insulation film
101e Channel layer
102 Passivation film
103 Planarization film
104 Anode
105 Contact plug
106 Banks
106a, 106b Bank elements
107 Hole injection layer
108 Organic light-emitting layer
108a, 108b, 108c Organic light-emitting layers
109 Electron transport layer
110 Cathode
300 Processing fluid
500 Resist coating device
501 Spin cup
502 Turntable
503 Motor
504 Controller
505 Effluent line
506 Discharge nozzle
507 Solvent
508 Supply line
510 Discharge nozzle
511 Sulfuric acid supply line
512 Aqueous hydrogen peroxide supply line
513 Chemical combiner
1030 Resist film

The invention claimed is:

1. An organic light-emitting element, comprising:
an organic electroluminescence layer including a pair of electrodes and an organic light-emitting layer disposed between the pair of electrodes;
a thin-film transistor layer formed below the organic electroluminescence layer, being electrically connected to one electrode of the pair of electrodes, and causing the organic electroluminescence layer to emit light; and
a planarization film disposed between the organic electroluminescence layer and the thin-film transistor layer, planarizing irregularities in an upper portion of the thin-film transistor layer such that the organic electroluminescence layer is formed over a planarised surface, wherein
the planarization film is made up of a silicon oxide monolayer, and
the planarization film made up of the silicon oxide monolayer is formed through:
using a predetermined liquid phase film formation method to apply a silicon-bearing organic solvent to the upper portion of the thin-film transistor layer and to planarize an upper surface of the silicon-bearing organic solvent, thus forming a silicon-bearing organic solvent film;
heating a predetermined solvent that includes a material having heat-increased oxidizing power to obtain a heated solvent; and
discharging the heated solvent onto the silicon-bearing organic solvent film having a planarised upper surface, wherein
the heated solvent dissolves organic components in the silicon-bearing organic solvent film while at least silicon in the silicon-bearing organic solvent film remains, and the silicon that remains undergoes liquid phase oxidation by the heated solvent.

2. The organic light-emitting element of claim 1, wherein the heating of the predetermined solvent is performed by combining a first solvent and a second solvent into a mixture, and then heating the mixture to a predetermined temperature.

3. The organic light-emitting element of claim 2, wherein heating the mixture to the predetermined temperature is performed by combining the first solvent and the second solvent in a common container and heating the common container.

4. The organic light-emitting element of claim 2, wherein heating the mixture to the predetermined temperature is performed by supplying the first solvent to a chemical combiner through a first supply line, supplying the second solvent to the chemical combiner through a second supply line, and combining the first solvent and the second solvent in the chemical combiner such that the mixture is heated through chemical reaction of the first solvent with the second solvent.

5. The organic light-emitting element of claim 4, wherein at least one of the first solvent and the second solvent is heated before the first solvent and the second solvent are combined in the chemical combiner.

6. The organic light-emitting element of claim 1, wherein the planarization film made up of the silicon oxide monolayer contains carbon atoms.

7. The organic light-emitting element of claim 1, wherein the silicon-bearing organic solvent has a silicon content of no less than 20 wt % and no more than 40 wt %.

8. The organic light-emitting element of claim 1, wherein the material having heat-increased oxidizing power included in the predetermined solvent is peroxymonosulfuric acid ($H_2SO_5$).

9. The organic light-emitting element of claim 8, wherein the peroxymonosulfuric acid ($H_2SO_5$) is produced by combining sulfuric acid and aqueous hydrogen peroxide.

10. The organic light-emitting element of claim 8, wherein the peroxymonosulfuric acid ($H_2SO_5$) is produced by sulfuric acid electrolysis.

11. The organic light-emitting element of claim 8, wherein the heat is increased by raising a temperature to no less than 130° C. and no more than 160° C.

12. The organic light-emitting element of claim 1, wherein the upper portion of the thin-film transistor layer has a protective film of a silicon-based material formed thereon, and
the planarization film is formed over the protective silicon film.

13. The organic light-emitting element of claim 1, wherein the predetermined liquid phase film formation method is one of a spin coat method and a slit coat method.

14. A display panel, comprising
the organic light-emitting element of claim 1.

15. A display device, comprising
the display panel of claim 14.

16. An organic light-emitting device manufacturing method, comprising:
forming a thin-film transistor layer;
forming a planarization film planarizing irregularities in a top portion of the thin-film transistor layer; and
forming a pair of electrodes and an organic electroluminescence layer on a planarised upper surface of the planarization film, the organic electroluminescence layer including an organic light-emitting layer disposed between the pair of electrodes, and one electrode of the pair of electrodes being electrically connected to the thin-film transistor layer, wherein
the planarization film is made up of a silicon oxide monolayer, and
forming the planarization film made up of the silicon oxide monolayer involves:
using a predetermined liquid phase film formation method to apply a silicon-bearing organic solvent to the upper portion of the thin-film transistor layer and to planarize an upper surface of the silicon-bearing organic solvent, thus forming a silicon-bearing organic solvent film;
heating a predetermined solvent that includes a material having heat-increased oxidizing power to obtain a heated solvent; and
discharging the heated solvent onto the silicon-bearing organic solvent film having a planarised upper surface, wherein
the heated solvent dissolves organic components in the silicon-bearing organic solvent film while at least silicon in the silicon-bearing organic solvent film remains, and the silicon that remains undergoes liquid phase oxidation by the heated solvent.

17. The organic light-emitting element manufacturing method of claim 16, wherein
the heating of the predetermined solvent is performed by combining a first solvent and a second solvent into a mixture, and then heating the mixture to a predetermined temperature.

18. The organic light-emitting element manufacturing method of claim 17, wherein
heating the mixture to the predetermined temperature is performed by combining the first solvent and the second solvent in a common container and heating the common container.

19. The organic light-emitting element manufacturing method of claim 17, wherein
heating the mixture to the predetermined temperature is performed by supplying the first solvent to a chemical combiner through a first supply line, supplying the second solvent to the chemical combiner through a second supply line, and combining the first solvent and the second solvent in the chemical combiner such that the mixture is heated through chemical reaction of the first solvent with the second solvent.

20. The organic light-emitting element manufacturing method of claim 19, wherein
at least one of the first solvent and the second solvent is heated before the first solvent and the second solvent are combined in the chemical combiner.

21. The organic light-emitting element manufacturing method of claim 16, wherein
the silicon-bearing organic solvent has a silicon content of no less than 20 wt % and no more than 40 wt %.

22. The organic light-emitting element manufacturing method of claim 16, wherein
the material having heat-increased oxidizing power included in the predetermined solvent is peroxymonosulfuric acid ($H_2SO_5$).

23. The organic light-emitting element manufacturing method of claim 22, wherein
the peroxymonosulfuric acid ($H_2SO_5$) is produced by combining sulfuric acid and aqueous hydrogen peroxide.

24. The organic light-emitting element manufacturing method of claim 22, wherein
the peroxymonosulfuric acid ($H_2SO_5$) is produced by sulfuric acid electrolysis.

25. The organic light-emitting element manufacturing method of claim 16, wherein
the heat is increased by raising a temperature to no less than 130° C. and no more than 160° C.

26. The organic light-emitting device manufacturing method of claim 16, further comprising additionally forming a protective film of a silicon-based material over the top portion of the thin-film transistor layer, performed between forming the thin-film transistor layer and forming the planarization film, wherein
the planarization film is formed over the protective silicon film.

27. The organic light-emitting element manufacturing method of claim 16, wherein
the predetermined liquid phase film formation method is one of a spin coat method and a slit coat method.

* * * * *